US011410951B2

(12) United States Patent
Choi et al.

(10) Patent No.: US 11,410,951 B2
(45) Date of Patent: Aug. 9, 2022

(54) THREE-DIMENSIONAL SEMICONDUCTOR MEMORY DEVICE

(71) Applicant: SAMSUNG ELECTRONICS CO., LTD., Suwon-si (KR)

(72) Inventors: Hyungeun Choi, Suwon-si (KR); Eun-Ji Kim, Seoul (KR); Jong-Ho Moon, Seoul (KR); Hyoungyol Mun, Yongin-si (KR); Han-Sik Yoo, Seongnam-si (KR); Kiseok Lee, Hwaseong-si (KR); Seungjae Jung, Suwon-si (KR); Taehyun An, Seoul (KR); Sangyeon Han, Suwon-si (KR); Yoosang Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/207,242

(22) Filed: Mar. 19, 2021

(65) Prior Publication Data

US 2022/0068859 A1  Mar. 3, 2022

(30) Foreign Application Priority Data

Aug. 25, 2020 (KR) .................. 10-2020-0107326

(51) Int. Cl.
| | |
|---|---|
| *H01L 27/108* | (2006.01) |
| *G11C 11/408* | (2006.01) |
| *H01L 25/065* | (2006.01) |
| *G11C 11/4091* | (2006.01) |
| *H01L 23/00* | (2006.01) |
| *H01L 25/18* | (2006.01) |

(52) U.S. Cl.
CPC .......... *H01L 24/08* (2013.01); *G11C 11/4085* (2013.01); *G11C 11/4091* (2013.01); *H01L 25/0657* (2013.01); *H01L 25/18* (2013.01); *H01L 27/10805* (2013.01); *H01L 27/10897* (2013.01); *H01L 2224/08145* (2013.01); *H01L 2924/1431* (2013.01); *H01L 2924/1436* (2013.01)

(58) Field of Classification Search
CPC ..... H01L 24/08; H01L 25/0657; H01L 25/18; H01L 27/10805; H01L 27/10897; H01L 2224/08145; H01L 2924/1431; H01L 2924/1436; G11C 11/4085; G11C 11/4091
See application file for complete search history.

(56) References Cited

U.S. PATENT DOCUMENTS

| | | | |
|---|---|---|---|
| 6,746,911 B2 | 6/2004 | Han | |
| 9,184,136 B2 | 11/2015 | Kim et al. | |
| 9,406,652 B2 | 8/2016 | Ahn et al. | |

(Continued)

FOREIGN PATENT DOCUMENTS

TW  201841344 A  11/2018

*Primary Examiner* — Thanh Y. Tran
(74) *Attorney, Agent, or Firm* — Sughrue Mion, PLLC

(57) ABSTRACT

A three-dimensional semiconductor memory device is provided. The device may include a first substrate including a bit-line connection region and a word-line connection region, a cell array structure on the first substrate, a second substrate including a first core region and a second core region, which are respectively overlapped with the bit-line connection region and the word-line connection region, and a peripheral circuit structure on the second substrate.

20 Claims, 25 Drawing Sheets

(56) References Cited

U.S. PATENT DOCUMENTS

| | | |
|---|---|---|
| 10,600,772 B2 | 3/2020 | Sukekawa |
| 2010/0327453 A1 | 12/2010 | Kim |
| 2018/0240797 A1 | 8/2018 | Yokoyama et al. |
| 2018/0277497 A1* | 9/2018 | Matsuo .................. H01L 25/18 |
| 2019/0252386 A1 | 8/2019 | Lee et al. |
| 2019/0363129 A1 | 11/2019 | Yokoyama et al. |
| 2020/0083229 A1 | 3/2020 | Kim et al. |
| 2020/0098762 A1 | 3/2020 | Sharma et al. |
| 2020/0105721 A1 | 4/2020 | Park |
| 2021/0233900 A1* | 7/2021 | Kim ..................... H01L 23/481 |
| 2022/0045005 A1* | 2/2022 | Cui ........................ H01L 25/50 |
| 2022/0068903 A1* | 3/2022 | Kim ....................... H01L 24/32 |

* cited by examiner

THREE-DIMENSIONAL SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2020-0107326, filed on Aug. 25, 2020, in the Korean Intellectual Property Office, the entire contents of which are hereby incorporated by reference.

BACKGROUND

1. Field

The present disclosure relates to a three-dimensional semiconductor memory device, and in particular, to a three-dimensional semiconductor memory device with improved reliability and an increased integration density.

2. Description of the Related Art

Higher integration of semiconductor devices is required to satisfy consumer demands for superior performance and inexpensive prices. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. To overcome such a limitation, there have been recently proposed three-dimensional semiconductor memory devices including three-dimensionally arranged memory cells.

SUMMARY

It is an aspect to provide a three-dimensional semiconductor memory device with improved reliability and an increase integration density.

According to an aspect of an example embodiment, a three-dimensional semiconductor memory device may include a first substrate including a bit-line connection region and a word-line connection region, a cell array structure on the first substrate, a second substrate including a first core region and a second core region, which are respectively overlapped with the bit-line connection region and the word-line connection region, and a peripheral circuit structure on the second substrate. The cell array structure may include word lines stacked on the first substrate, bit lines crossing the word lines in a first direction perpendicular to a top surface of the first substrate, first lower metal pads provided on the bit-line connection region and connected to the bit lines, and second lower metal pads provided on the word-line connection region and connected to the word lines. The peripheral circuit structure may include sense amplifiers provided on the first core region, sub-word line drivers provided on the second core region, first upper metal pads provided on the first core region and connected to the sense amplifiers, and second upper metal pads provided on the second core region and connected to the sub-word line drivers. The first lower metal pads may be bonded to the first upper metal pads, and the second lower metal pads may be bonded to the second upper metal pads.

According to another aspect of an example embodiment, a three-dimensional semiconductor memory device may include a first substrate including a bit-line connection region, a word-line connection region, and a first peripheral region, a cell array structure including a memory cell array, which includes memory cells three-dimensionally arranged on the bit-line connection region and the word-line connection region of the first substrate, and the cell array structure including lower control circuits, which are provided on the first peripheral region of the first substrate, a second substrate including a first core region, a second core region, and a second peripheral region, which are overlapped with the bit-line connection region, the word-line connection region, and the first peripheral region, respectively, and a peripheral circuit structure including sense amplifiers provided on the first core region of the second substrate, sub-word line drivers provided on the second core region of the second substrate, and upper control circuits provided on the second peripheral region of the second substrate.

According to yet another aspect of an example embodiment, a three-dimensional semiconductor memory device may include a first substrate including a bit-line connection region, a word-line connection region, and a first peripheral region, a cell array structure on the first substrate, the cell array structure including bit lines, which are extended in a first direction perpendicular to a top surface of the first substrate, word lines, which are extended in a second direction to cross the bit lines, memory cells, which are provided at intersections of the bit lines and the word lines, first lower metal pads, which are provided on the bit-line connection region and are connected to the bit lines, second lower metal pads, which are provided on the word-line connection region and are connected to the word lines, and third lower metal pads, which are provided on the first peripheral region and are connected to lower control circuits, a second substrate including a first core region, a second core region, and a second peripheral region, which are overlapped with the bit-line connection region, the word-line connection region, and the first peripheral region, respectively, and a peripheral circuit structure on the second substrate. The peripheral circuit structure may include first upper metal pads provided on the first core region and connected to sense amplifiers, second upper metal pads provided on the second core region and connected to sub-word line drivers, and third upper metal pads provided on the second peripheral region and connected to upper control circuits. The first lower metal pads may be bonded to the first upper metal pads, the second lower metal pads may be bonded to the second upper metal pads, and the third lower metal pads may be bonded to the third upper metal pads.

BRIEF DESCRIPTION OF THE DRAWINGS

Example embodiments will be more clearly understood from the following brief description taken in conjunction with the accompanying drawings, in which.

DETAILED DESCRIPTION

Example embodiments will now be described more fully with reference to the accompanying drawings, in which example embodiments are shown. The accompanying drawings represent non-limiting, example embodiments as described herein.

Figure 1:
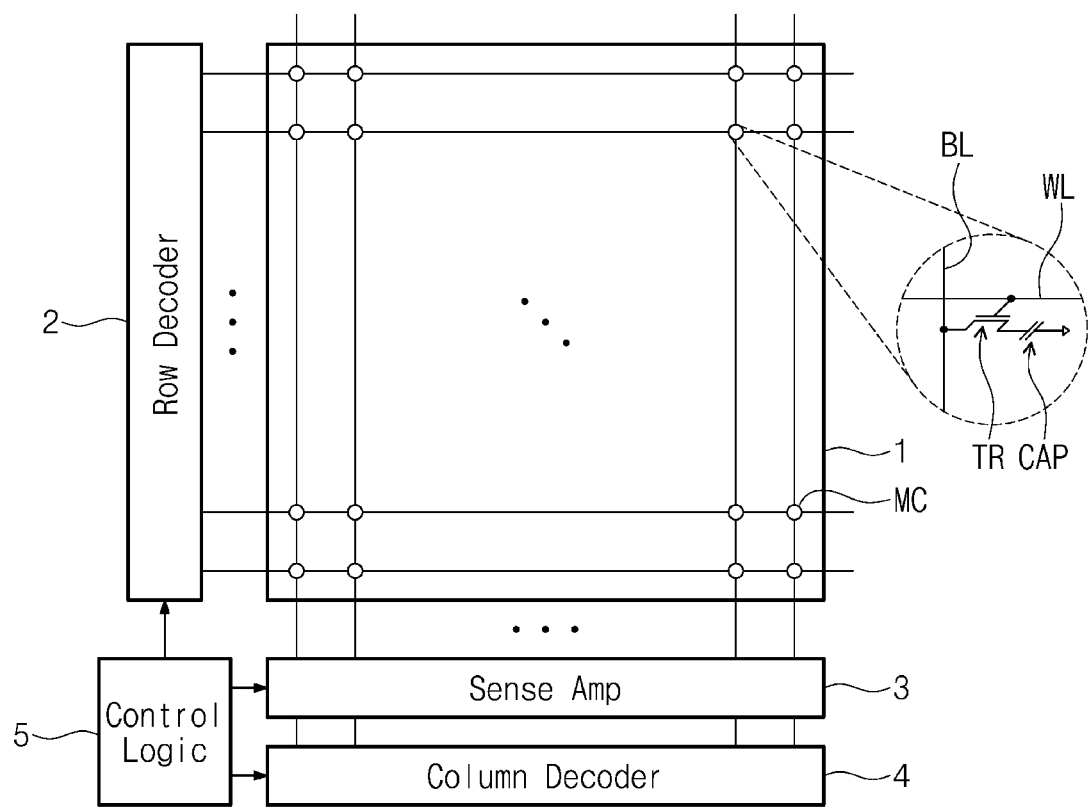
FIG. 1 is a block diagram illustrating a three-dimensional semiconductor memory device according to an example embodiment.

FIG. 1 is a block diagram illustrating a three-dimensional semiconductor memory device according to an example embodiment.

Referring to FIG. 1, a three-dimensional semiconductor memory device may include a memory cell array 1, a row decoder 2, a sensing amplifier (Sense Amp) 3, a column decoder 4, and a control logic 5.

The memory cell array 1 may include a plurality of memory cells MC, which are three-dimensionally arranged. Each of the memory cells MC may be provided between and connected to a word line WL and a bit line BL, which are disposed to cross each other.

Each of the memory cells MC may include a selection element TR and a data storing element CAP, which are electrically connected to each other in series. The data storing element CAP may be connected to the bit line BL through the selection element TR, and the selection element TR may be provided between and connected to the data storing element CAP and the word line WL. The selection element TR may be a field effect transistor (FET), and the data storing element CAP may be realized with a capacitor, a variable resistor, or the like. As an example, the selection element TR may include a transistor, which has a gate electrode connected to the word line WL and drain/source terminals connected to the bit line BL and the data storing element CAP, respectively.

The row decoder 2 may be configured to decode address information, which is input from outside the three-dimensional semiconductor memory device, and to select one of the word lines WL of the memory cell array 1, based on the decoded address information. The address information decoded by the row decoder 2 may be provided to a row driver (not shown), and in this case, the row driver may provide predetermined voltages to the selected one of the word lines WL and the unselected ones of the word lines WL, respectively, in response to the control of a control circuit.

The sensing amplifier (Sense Amp) 3 may be configured to sense, amplify, and output a difference in voltage between one of the bit lines BL, which is selected based on address information decoded by the column decoder 4, and a reference bit line.

The column decoder 4 may provide a data transmission path between the sensing amplifier 3 and an external device (e.g., a memory controller). The column decoder 4 may be configured to decode address information, which is input from outside the three-dimensional semiconductor memory device, and to select one of the bit lines BL, based on the decoded address information.

The control logic 5 may be configured to generate control signals, which are used to control data writing or reading operations on the memory cell array 1.

Figure 2:
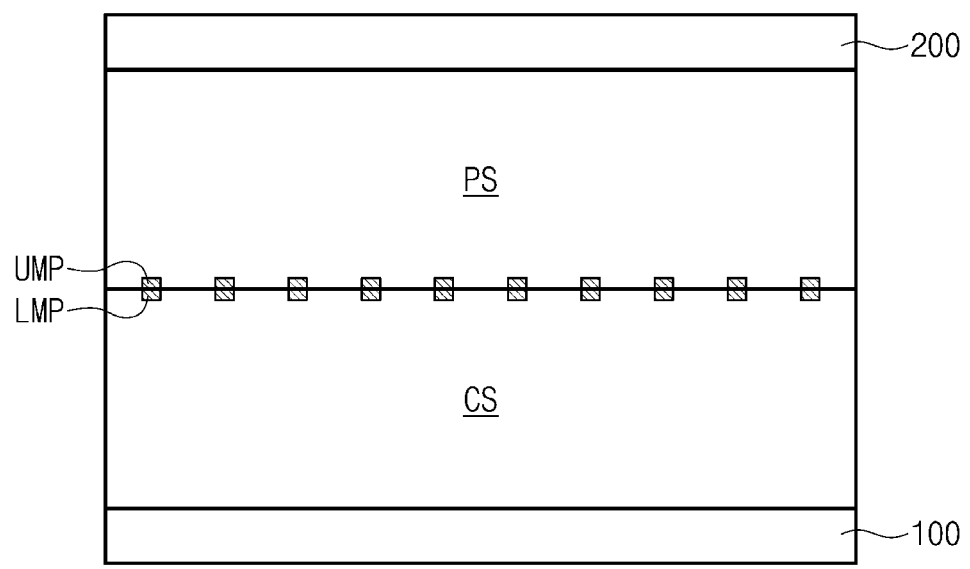
FIG. 2 is a sectional view schematically illustrating a three-dimensional semiconductor memory device according to an example embodiment.

FIG. 2 is a sectional view schematically illustrating a three-dimensional semiconductor memory device according to an example embodiment.

Referring to FIG. 2, a three-dimensional semiconductor memory device may include a cell array structure CS and a peripheral circuit structure PS on the cell array structure CS.

The cell array structure CS may include a memory cell array including memory cells, which are three-dimensionally arranged on a first substrate 100. For example, the cell array structure CS may include the memory cell array 1 including the memory cells MC described with reference to FIG. 1. The memory cell array may include horizontal patterns, which are sequentially stacked on the first substrate 100, vertical patterns, which are provided to vertically cross the horizontal patterns, and memory elements, which are interposed between the horizontal and vertical patterns. For example, the horizontal patterns may be provided in a first direction D1 and/or a second direction D2, and the vertical patterns may be provided in a third direction D3, as discussed later. However, this is only an example.

The peripheral circuit structure PS may include core and peripheral circuits, which are formed on a second substrate 200. The core and peripheral circuits may include the row and column decoders 2 and 4, the sensing amplifier (Sense Amp) 3, and the control logic 5 described with reference to FIG. 1.

Lower metal pads LMP may be provided at the topmost level of the cell array structure CS. The lower metal pads LMP may be electrically connected to the memory cell array. Upper metal pads UMP may be provided at the topmost level of the peripheral circuit structure PS. The upper metal pads UMP may be electrically connected to the core and peripheral circuits.

The lower and upper metal pads LMP and UMP may have substantially the same size and arrangement. The lower and upper metal pads LMP and UMP may be formed of or include at least one of, for example, copper (Cu), aluminum (Al), nickel (Ni), cobalt (Co), tungsten (W), titanium (Ti), tin (Sn), or alloys thereof.

According to an example embodiment, the three-dimensional semiconductor memory device may be fabricated by forming the cell array structure CS including the memory cells, which are three-dimensionally arranged on the first substrate 100, forming the peripheral circuit structure PS including the core and peripheral circuits, which are formed on the second substrate 200 different from the first substrate 100, and then, connecting the first substrate 100 to the second substrate 200 in a bonding manner. That is, the lower metal pads LMP of the cell array structure CS and the upper metal pads UMP of the peripheral circuit structure PS may be electrically and physically connected to each other in the bonding manner. In other words, the lower metal pads LMP may be in direct contact with the upper metal pads UMP.

Figure 3:
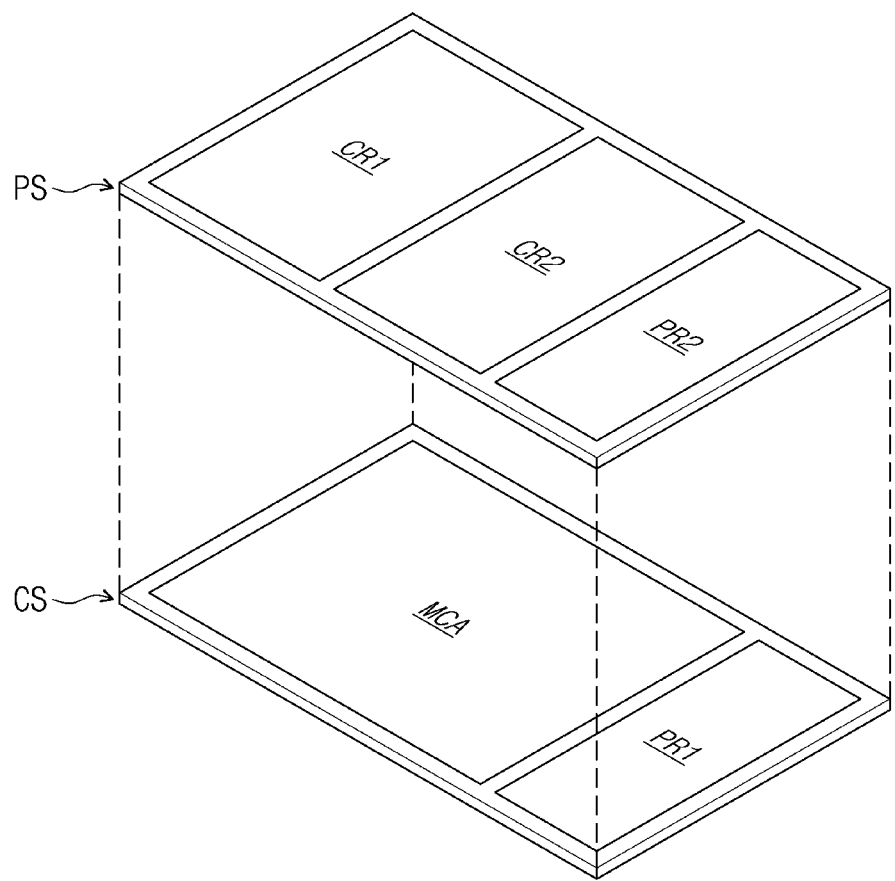
FIG. 3 is a perspective view schematically illustrating a three-dimensional semiconductor memory device according to an example embodiment.

FIG. 3 is a perspective view schematically illustrating a three-dimensional semiconductor memory device according to an example embodiment.

Referring to FIG. 3, the cell array structure CS may include a memory cell array region MCA and a first peripheral region PR1. The peripheral circuit structure PS may include a first core region CR1, a second core region CR2, and a second peripheral region PR2. The first and second core regions CR1 and CR2 may be overlapped with the memory cell array region MCA, when viewed in a plan view. The first peripheral region PR1 may be provided at a side of the memory cell array region MCA, and the second peripheral region PR2 may be provided at a side of the second core region CR2. The second peripheral region PR2 may be overlapped with the first peripheral region PR1, when viewed in a plan view.

A memory cell array including three-dimensionally arranged memory cells may be provided in the memory cell array region MCA. In other words, word and bit lines, which are disposed to cross each other, and memory cells, which are disposed between the word and bit lines, may be provided in the memory cell array region MCA.

A plurality of sense amplifiers may be provided in the first core region CR1, and a plurality of sub-word line drivers may be provided in the second core region CR2.

A control signal generating circuit that controls the sub-word line driver and a control signal generating circuit that controls the sense amplifier may be provided in the first and second peripheral regions PR1 and PR2. In addition, voltage generators that provide operation voltages to the sense amplifier and the sub-word line driver may be disposed in the first and second peripheral regions PR1 and PR2.

Figure 4:
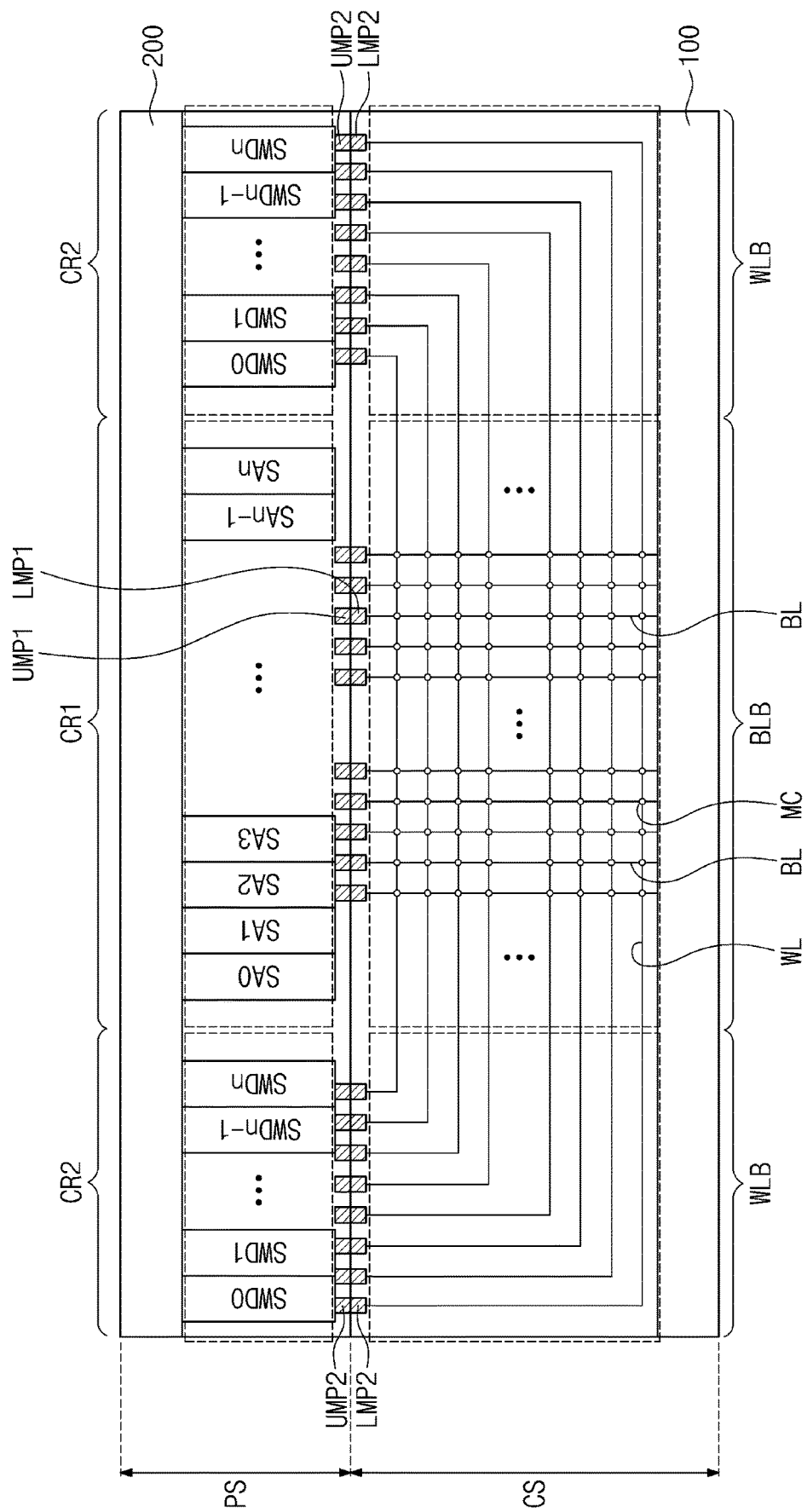
FIG. 4 is a diagram illustrating an example of a cell array structure and a peripheral circuit structure that are disposed in a three-dimensional semiconductor memory device according to an example embodiment.

FIG. 4 is a sectional view schematically illustrating an example of a cell array structure and a peripheral circuit structure that are disposed in a three-dimensional semiconductor memory device according to an example embodiment.

Referring to FIG. 4, in the cell array structure CS, the memory cell array region may include a bit-line connection region BLB and word-line connection regions WLB, which are provided at both sides of the bit-line connection region BLB.

The cell array structure CS may include the word lines WL, which are provided to be parallel to a top surface of the first substrate 100, and the bit lines BL, which are provided to be perpendicular to the top surface of the first substrate 100. The memory cells MC may be provided at respective intersections of the word and bit lines WL and BL.

The bit lines BL may be provided in the bit-line connection region BLB, and the word lines WL may be extended from the bit-line connection region BLB to the word-line connection regions WLB.

The cell array structure CS may include first lower metal pads LMP1, which are provided in the bit-line connection region BLB, and second lower metal pads LMP2, which is provided in the word-line connection regions WLB. The first lower metal pads LMP1 may be electrically connected to the bit lines BL, and the second lower metal pads LMP2 may be electrically connected to the word lines WL.

The peripheral circuit structure PS may include the first core region CR1 and the second core regions CR2, which are provided at both sides of the first core region CR1 as shown in the example illustrated in FIG. 4. When viewed in a plan view, the first core region CR1 may be overlapped with the bit-line connection region BLB, and the second core regions CR2 may be overlapped with the word-line connection regions WLB, respectively.

A plurality of sense amplifiers SA0-SAn may be provided in the first core region CR1, and each of the sense amplifiers SA0-SAn may be provided corresponding to a pair of the bit lines BL. That is, each of the sense amplifiers SA0-San may be provided corresponding to two of the bit lines BL. A plurality of sub-word line drivers SWD0-SWDn may be provided in each of the second core regions CR2.

The peripheral circuit structure PS may include first upper metal pads UMP1, which are provided in the first core region CR1, and second upper metal pads UMP2, which are provided in the second core regions CR2. The first upper metal pads UMP1 may be connected to the sense amplifiers SA0-SAn, and the second upper metal pads UMP2 may be connected to the sub-word line drivers SWD0-SWDn.

The first upper metal pads UMP1 may be directly connected to the first lower metal pads LMP1, and the second upper metal pads UMP2 may be directly connected to the second lower metal pads LMP2. The first upper metal pads UMP1 may have substantially the same size and arrangement as the first lower metal pads LMP1. The second upper metal pads UMP2 may have substantially the same size and arrangement as the second lower metal pads LMP2. The first and second lower and upper metal pads LMP1, LMP2, UMP1, and UMP2 may include the same metallic material and may have substantially the same size or area. The first and second lower and upper metal pads LMP1, LMP2, UMP1, and UMP2 may be formed of or include at least one of, for example, copper (Cu), aluminum (Al), nickel (Ni), cobalt (Co), tungsten (W), titanium (Ti), tin (Sn), or alloys thereof.

Figure 5A:
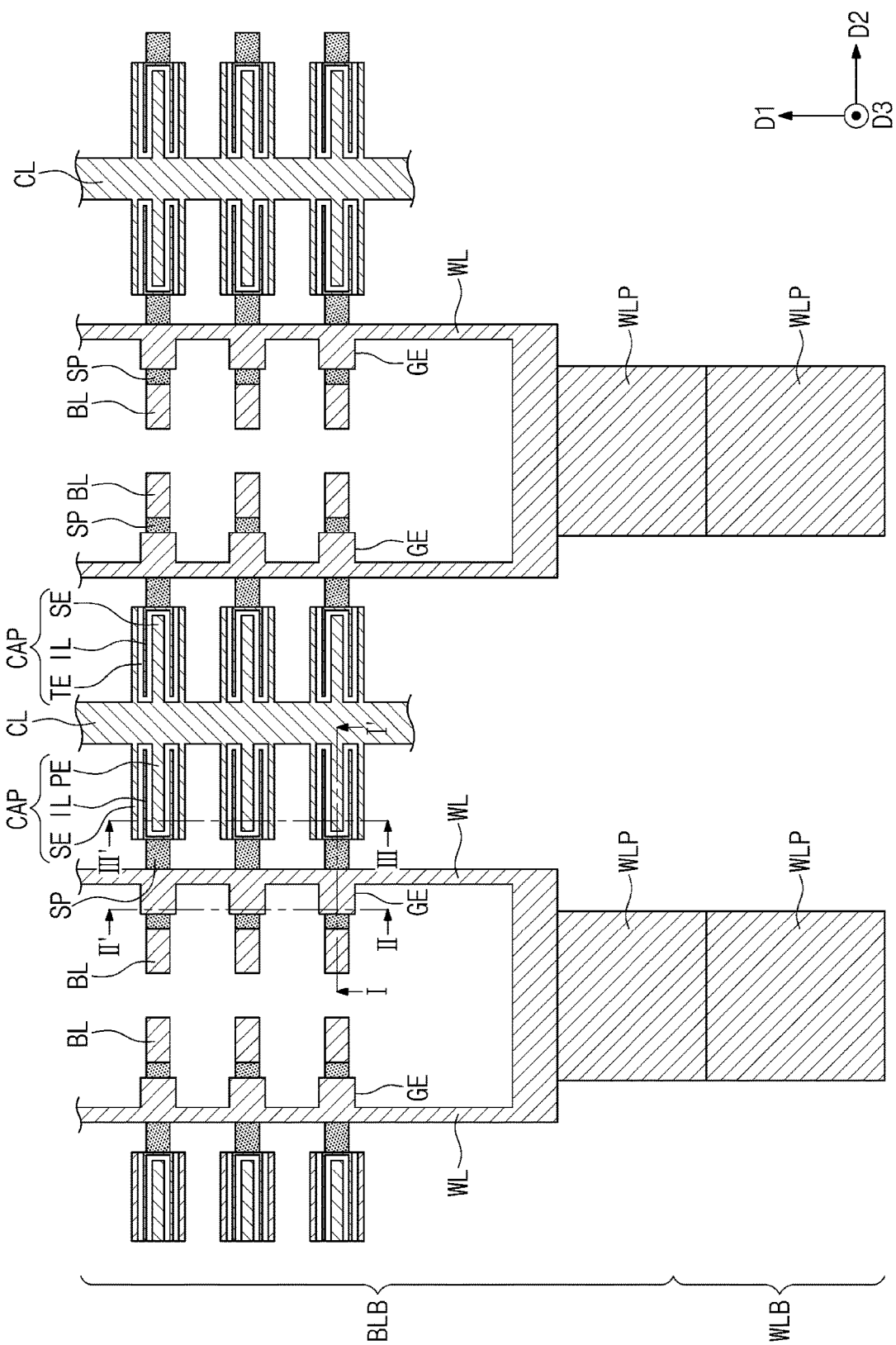
FIGS. 5A and 5B are plan views illustrating a cell array structure of a three-dimensional semiconductor memory device according to example embodiments.
Figure 5B:
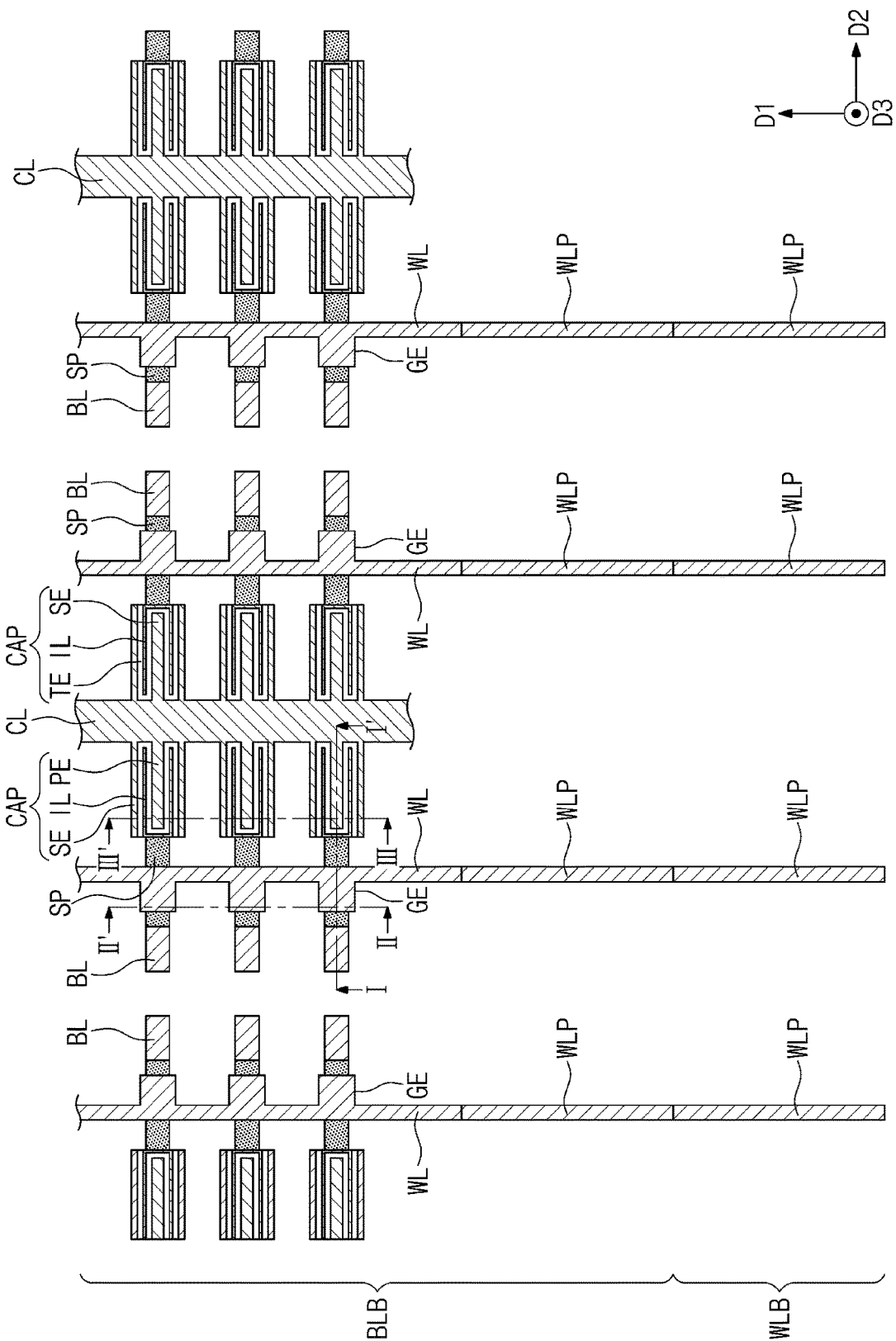
Figure 6A:
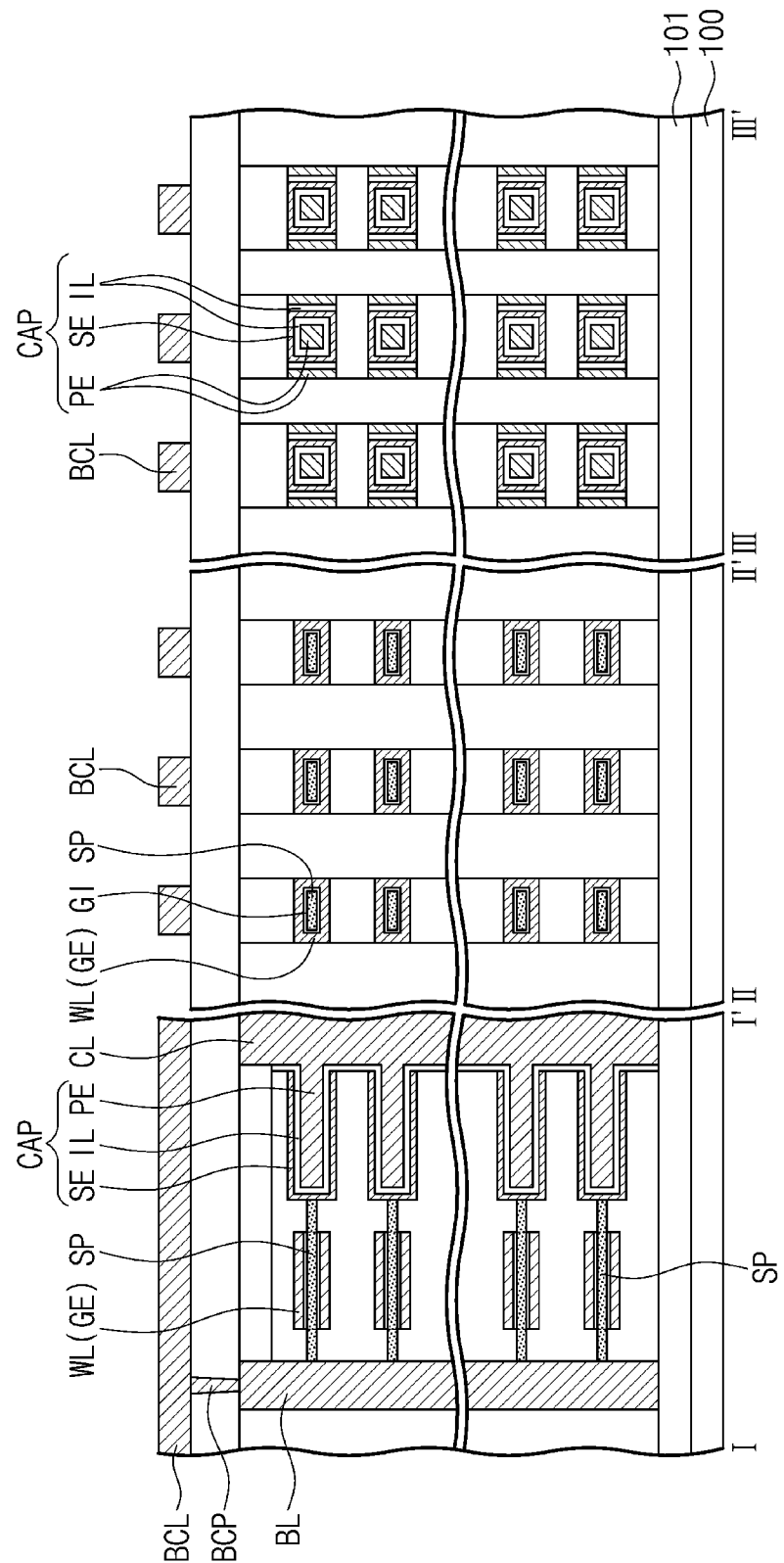
FIGS. 6A and 6B are sectional views, each of which illustrates sections taken along lines I-I', and of FIGS. 5A and 5B, respectively.
Figure 6B:
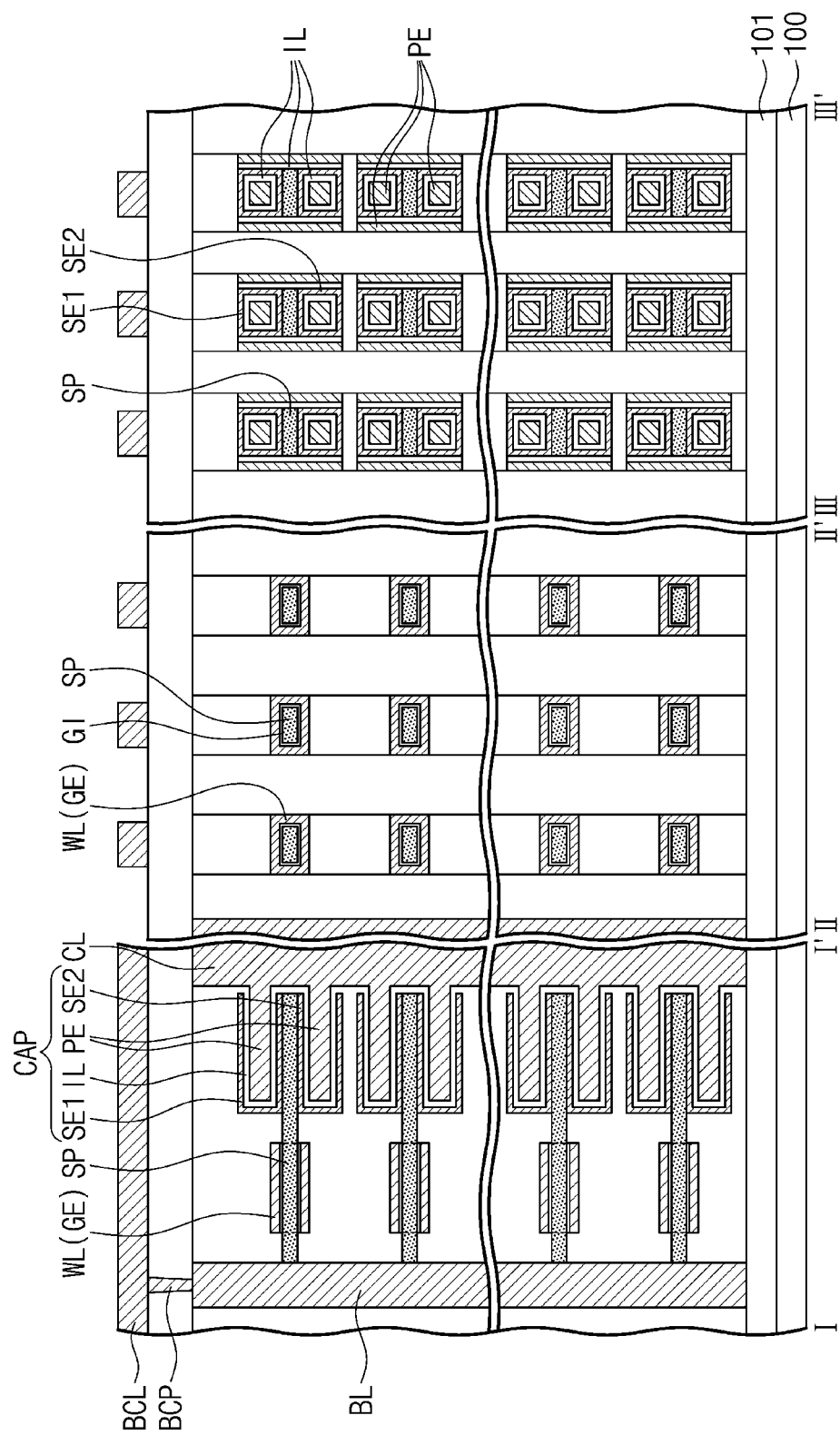
Figure 7:
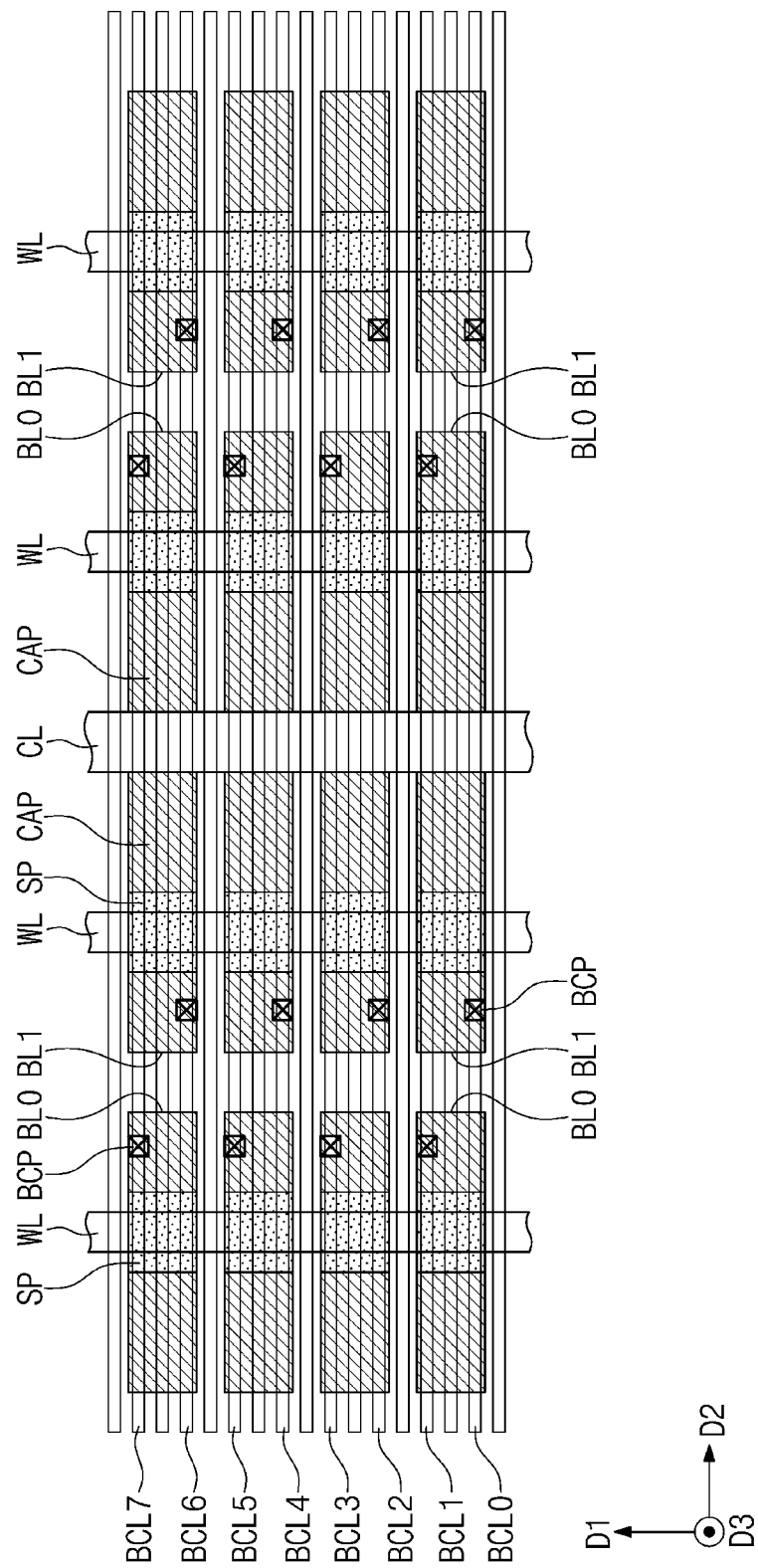
FIG. 7 is a diagram exemplarily illustrating a connection structure between bit lines and bit-line connection lines in a three-dimensional semiconductor memory device according to an example embodiment.
Figure 8:
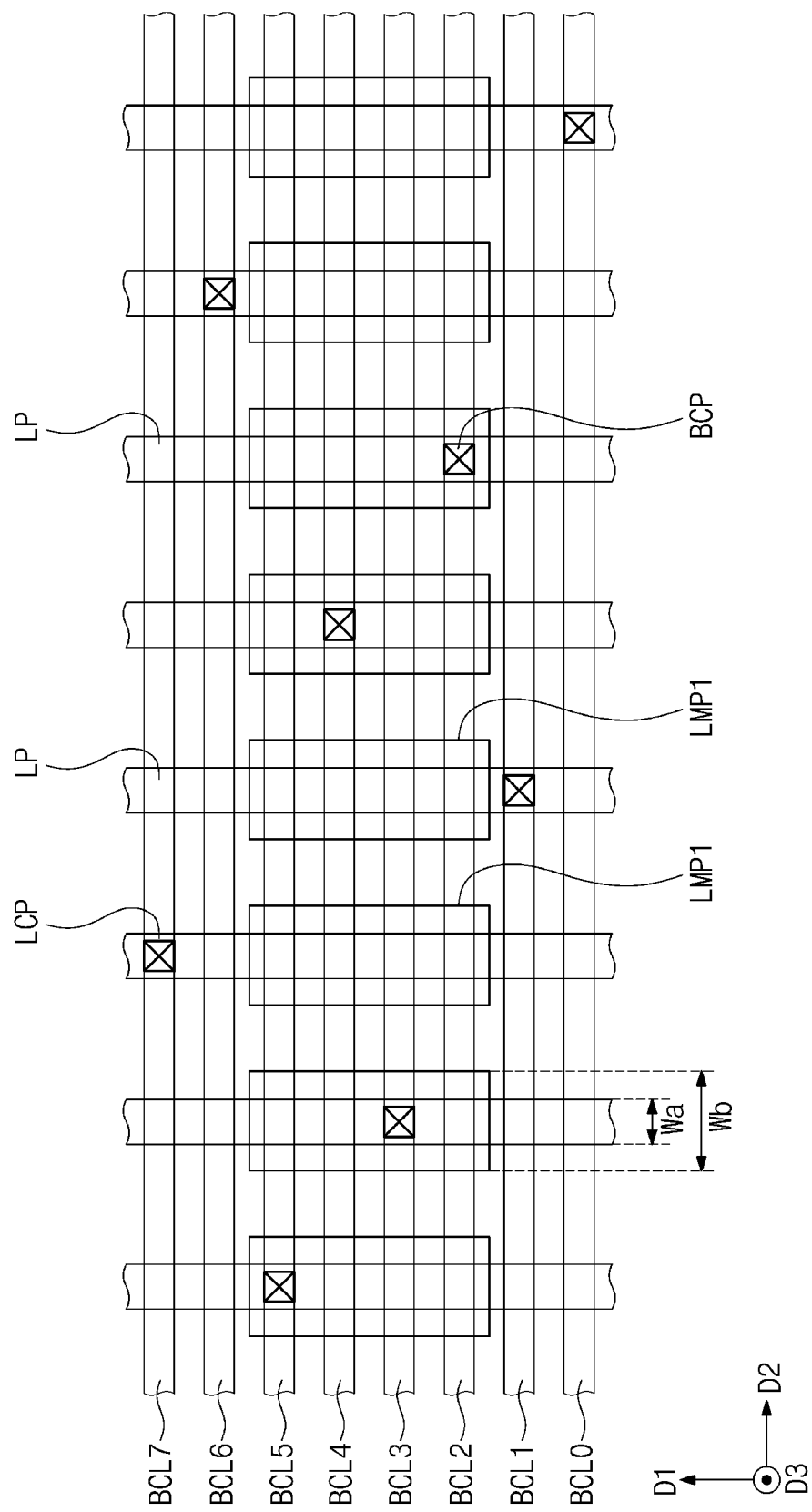
FIG. 8 is a diagram exemplarily illustrating a connection structure between bit lines and metal pads in a three-dimensional semiconductor memory device according to an example embodiment.

FIGS. 5A and 5B are plan views illustrating a cell array structure of a three-dimensional semiconductor memory device according to example embodiments. FIGS. 6A and 6B are sectional views, each of which illustrates sections taken along lines I-I', II-II', and III-III' of FIGS. 5A and 5B, respectively. FIG. 7 is a diagram exemplarily illustrating a connection structure between bit lines and bit-line connection lines in a three-dimensional semiconductor memory device according to an example embodiment. FIG. 8 is a diagram exemplarily illustrating a connection structure between bit lines and lower metal pads in a three-dimensional semiconductor memory device according to an example embodiment.

Referring to FIGS. 5A and 6A, the cell array structure of the three-dimensional semiconductor memory device may include the bit-line connection region BLB and the word-line connection region WLB.

Word line structures may be disposed on the first substrate 100, and in an example embodiment, the word line structures may include the word lines WL, which are vertically stacked on the first substrate 100. The first substrate 100 may be formed of or include a semiconductor material. For example, the first substrate 100 may be a single crystalline silicon substrate or a silicon-on-insulator (SOI) substrate.

The word line structures may be extended from the bit-line connection region BLB to the word-line connection region WLB. The word line structures may be extended in the first direction D1 and may be spaced apart from each other the second direction D2 crossing the first direction D1. The first and second directions D1 and D2 may be parallel to the top surface of the first substrate 100.

Each of the word line structures may include interlayer insulating layers and the word lines WL, which are alternately stacked in the third direction D3 (i.e., a vertical direction) that is perpendicular to the first and second directions D1 and D2.

Referring to FIG. 5A, a pair of the word line structures may be connected to each other in the bit-line connection region BLB. For example, two of the word lines WL, which are located at the same level, may be connected to each other in the bit-line connection region BLB.

Word-line pads WLP may be provided in the word-line connection region WLB. Each of the word-line pads WLP may be shared in common by a corresponding pair of the word lines WL. The word-line pads WLP may be stacked on the first substrate 100 such that the word-line pads WLP form a stepwise structure in the word-line connection region WLB. The word-line pads WLP may be placed at positions that are horizontally and vertically different from each other.

In another example embodiment, each word line in each of the word line structures may have the word-line pad WLP in the word-line connection region WLB, as shown in FIG. 5B. For example, the word-line pads WLP, which are located at the same level and are adjacent to each other in the second direction D2, may be spaced apart from each other. Each of the word line structures may have a stepwise structure in the word-line connection region WLB, and the stepwise structure may include the word-line pads WLP of the word lines WL, which are located at different levels.

As illustrated in FIGS. 5A and 5B, each of the word lines WL may include a line portion, which is extended in the first direction D1, and gate electrode portions GE, which are extended from the line portion in the second direction D2 to have a protruding shape. When viewed in a plan view, each pair of the word lines WL may be provided such that the gate electrode portions GE thereof have the mirror symmetry. The word lines WL may be formed of or include at least one of doped semiconductor materials (e.g., doped silicon, doped germanium, and so forth), conductive metal nitrides (e.g., titanium nitride, tantalum nitride, and so forth), metallic materials (e.g., tungsten, titanium, tantalum, and so forth), or metal-semiconductor compounds (e.g., tungsten silicide, cobalt silicide, titanium silicide, and so forth).

Semiconductor patterns SP, which are three-dimensionally arranged, may be disposed in the bit-line connection region BLB. The semiconductor patterns SP may be stacked in the third direction D3 and may be spaced apart from each other in both of the first and second directions D1 and D2.

Each of the semiconductor patterns SP may be a bar-shaped pattern, which is elongated in the second direction D2. Each of the semiconductor patterns SP may include a first end portion and a second end portion, which are spaced apart from each other, and a channel portion, which is provided between the first and second end portions. The semiconductor patterns SP may be formed of or include at least one of silicon or germanium. The first and second end portions of each semiconductor pattern SP may be doped with impurities. In an example embodiment, the semiconductor patterns SP may be formed of or include an oxide semiconductor material. As an example, the oxide semiconductor material may include at least one of indium (In), gallium (Ga), zinc (Zn), or tin (Sn). The oxide semiconductor material may be indium-gallium-zinc-oxide (IGZO) containing indium (In), gallium (Ga), and zinc (Zn).

The semiconductor patterns SP may be respectively provided to penetrate the gate electrode portions GE of the word lines WL in the second direction D2. Each word line WL may be provided to fully surround the channel portion of the semiconductor pattern SP (for example, to have a gate-all-around structure). Gate insulating layers GI may be interposed between the channel portions of the semiconductor patterns SP and the word lines WL.

In the bit-line connection region BLB, the bit lines BL may be extended in the third direction D3 to cross the word line structures. The bit lines BL may have substantially the same length, when measured in the third direction D3. The bit lines BL may be arranged to be spaced apart from each other in the first and second directions D1 and D2.

A lower insulating layer 101 may be disposed between the bit lines BL and the first substrate 100. Each of the bit lines BL may be connected to the first end portions of the semiconductor patterns SP, which are stacked in the third direction D3. The bit lines BL may be formed of or include at least one of doped semiconductor materials (e.g., doped silicon, doped germanium, and so forth), conductive metal nitrides (e.g., titanium nitride, tantalum nitride, and so forth), metallic materials (e.g., tungsten, titanium, tantalum, and so forth), or metal-semiconductor compounds (e.g., tungsten silicide, cobalt silicide, titanium silicide, and so forth).

The data storing element CAP may be connected to the second end portion of each semiconductor pattern SP. In an example embodiment, the data storing element CAP may be a capacitor. In other words, a storage electrode SE of the capacitor may be connected to the second end portion of each semiconductor pattern SP.

Referring to FIG. 6A, the data storing elements CAP may be provided at substantially the same level as the semiconductor patterns SP. In other words, the storage electrodes SE may be stacked in the third direction D3 and may be elongated in the second direction D2. In some example embodiments, the storage electrode SE of each data storing element CAP may have a hollow cylinder shape. Alternatively, in other example embodiments, the storage electrode SE may be a pillar-shaped pattern, which is elongated in the second direction D2. The storage electrode SE may be formed of or include at least one of metallic materials, metal nitrides, or metal silicides.

A dielectric layer IL may be provided to conformally cover a surface of each storage electrode SE, and a plate electrode PE may be provided on the dielectric layer IL. The plate electrode PE may be provided to cover inner and outer surfaces of the storage electrode SE provided with the dielectric layer IL. The dielectric layer IL may be formed of or include at least one of metal oxides (e.g., hafnium oxide, zirconium oxide, aluminum oxide, lanthanum oxide, tantalum oxide, and titanium oxide) or perovskite dielectric materials (e.g., $SrTiO_3$ (STO), $(Ba,Sr)TiO_3$ (BST), $BaTiO_3$, PZT, and PLZT).

The plate electrode PE may be provided to fill an inner space of the storage electrode SE provided with the dielectric layer IL. In addition, the plate electrode PE may be provided to cover an outer side surface of the storage electrode SE, and here, the dielectric layer IL may be interposed between the plate electrode PE and the storage electrode SE. The plate electrodes PE may be connected in common to a common conductive line CL. The common conductive line CL may be extended in the first and third directions D1 and D3. In other words, the common conductive line CL may be connected in common to the plate electrodes PE, which are arranged in the first and third directions D1 and D3. Furthermore, the plate electrodes PE, which are adjacent to each other in the second direction D2, may be connected in common to the common conductive line CL. In an example embodiment, the plate electrodes PE and the common conductive line CL may be formed at the same time and may be formed of the same material, without any internal interface.

According to the embodiment shown in FIG. 6B, each data storing element CAP may include a first storage electrode SE1, which is in contact with a top surface of the second end portion of the semiconductor pattern SP, and a second storage electrode SE2, which is in contact with a bottom surface of the second end portion of the semiconductor pattern SP. In other words, the second end portion of the semiconductor pattern SP may be disposed between the first and second storage electrodes SE1 and SE2 in the third direction D3.

The dielectric layer IL may be provided to conformally cover surfaces of the first and second storage electrodes SE1 and SE2. The plate electrode PE may be provided to fill inner spaces of the first and second storage electrodes SE1 and SE2 provided with the dielectric layer IL. In addition, the plate electrode PE may be provided to cover outer side surfaces of the first and second storage electrodes SE1 and SE2.

Referring back to FIGS. 6A and 6B, bit line contact plugs BCP may be coupled to the bit lines BL, respectively. Bit-line connection lines BCL may be extended in the second direction D2 to be parallel to each other and may be connected to the bit lines BL through the bit line contact plugs BCP.

The connection structure between the bit lines BL and the bit-line connection lines BCL will be described in more detail with reference to FIG. 7.

FIG. 7 is a diagram exemplarily illustrating a connection structure between bit lines and bit-line connection lines in a three-dimensional semiconductor memory device according to an example embodiment. Although the semiconductor patterns and the data storing element are briefly illustrated in FIG. 7, the semiconductor patterns and the data storing element may be substantially the same as those described with reference to FIGS. 5A, 5B, 6A, and 6B.

Referring to FIG. 7, two columns of the bit lines BL may be disposed between each pair of the word lines WL. The bit lines BL may include first and second bit lines BL0 and BL1, which are alternately arranged in the second direction D2.

The bit-line connection lines BCL may be extended in the second direction D2 to cross the word lines WL and the common conductive line CL. Two or more bit-line connection lines BCL may cross the first and second bit lines BL0 and BL1, when viewed in a plan view. For example, two or more bit-line connection lines BCL0-BCL7 may be overlapped with each of the bit lines BL.

The bit-line connection lines BCL may include odd-numbered bit-line connection lines BCL1, BCL3, BCL5, and BCL7 and even-numbered bit-line connection lines BCL0, BCL2, BCL4, and BCL6, which are alternately arranged in the first direction D1. In an example embodiment, dummy connection lines may be respectively provided between the odd-numbered bit-line connection lines BCL1, BCL3, BCL5, and BCL7 and the even-numbered bit-line connection lines BCL0, BCL2, BCL4, and BCL6.

Each of the odd-numbered bit-line connection lines BCL1, BCL3, BCL5, and BCL7 may be connected to the first bit lines BL0, which are arranged in the second direction D2, through the bit line contact plugs BCP.

Each of the even-numbered bit-line connection lines BCL0, BCL2, BCL4, and BCL6 may be connected to the second bit lines BL1, which are arranged in the second direction D2, through the bit line contact plugs BCP.

FIG. 8 is a diagram exemplarily illustrating a connection structure between bit lines and metal pads in a three-dimensional semiconductor memory device according to an example embodiment.

Referring to FIG. 8, landing conductive patterns LP may be provided on the bit-line connection lines BCL0-BCL7. The landing conductive patterns LP may be extended in the first direction D1 to cross the bit-line connection lines BCL0-BCL7 and may be spaced apart from each other in the second direction D2, on the bit-line connection lines BCL0-BCL7. Each of the landing conductive patterns LP may be overlapped with a predetermined number of the bit-line connection lines BCL0-BCL7.

The first lower metal pads LMP1 may be disposed on the landing conductive patterns LP, respectively. In some example embodiments, the first lower metal pads LMP may be connected to the landing conductive patterns LP through landing contact plugs. Alternatively, in other example embodiments, the first lower metal pads LMP1 may be in direct contact with top surfaces of the landing conductive patterns LP. When measured in the second direction D2, each of the first lower metal pads LMP1 may have a second width Wb, which is greater than a first width Wa of the landing conductive pattern LP. When measured in the second direction D2, a distance between adjacent ones of the first lower metal pads LMP1 may be smaller than a distance between adjacent ones of the landing conductive patterns LP. When measured in the first direction D1, each of the first lower metal pads LMP1 may have a second length that is smaller than a first length of the landing conductive patterns LP.

According to various example embodiments, each of the first upper metal pads UMP1 of the peripheral circuit structure PS, which were described with reference to FIG. 4, may be bonded to a corresponding one of the first lower metal pads LMP1 shown in FIG. 8.

Figure 9:
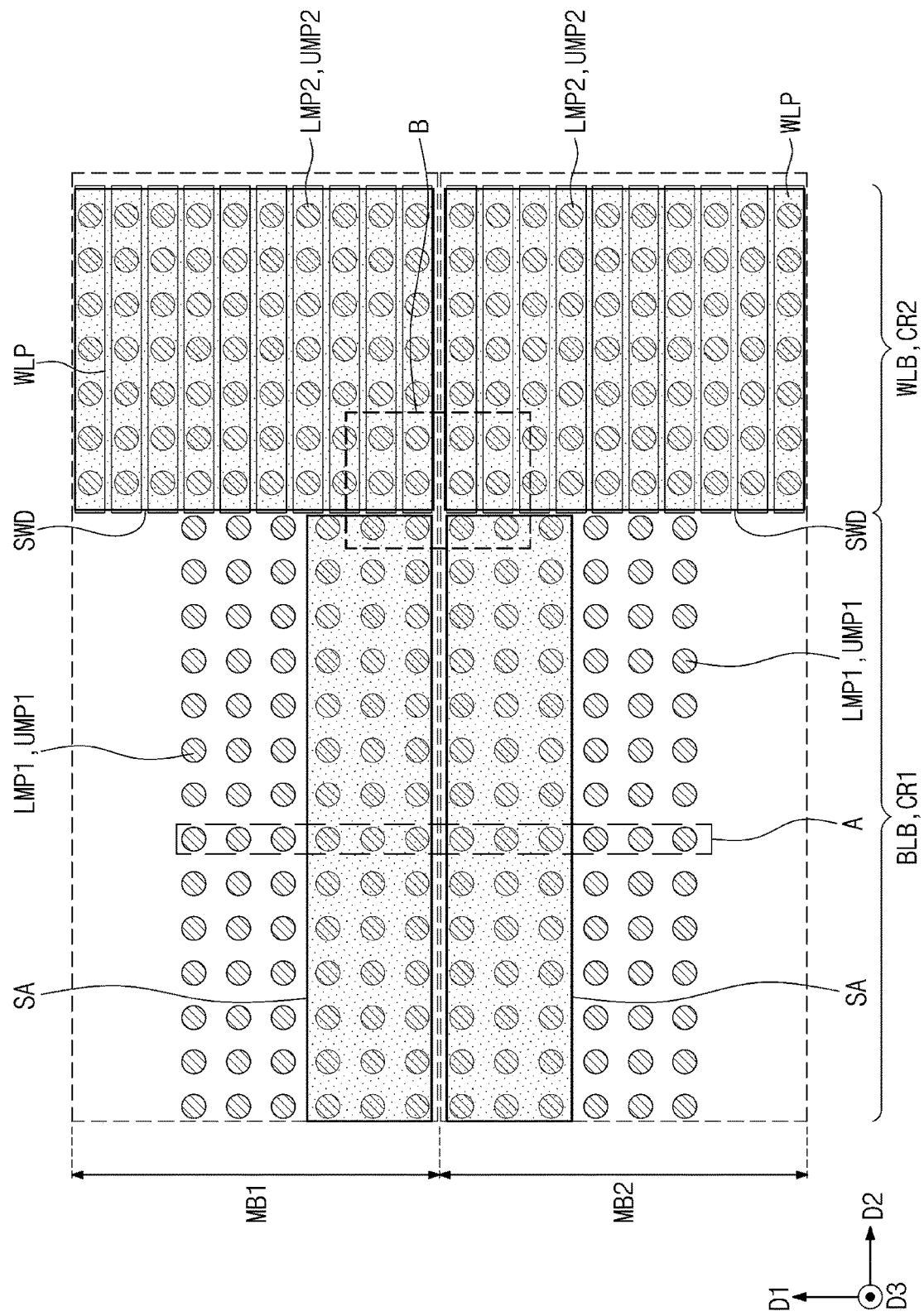
FIG. 9 is a plan view schematically illustrating a three-dimensional semiconductor memory device according to an example embodiment.
Figure 10:
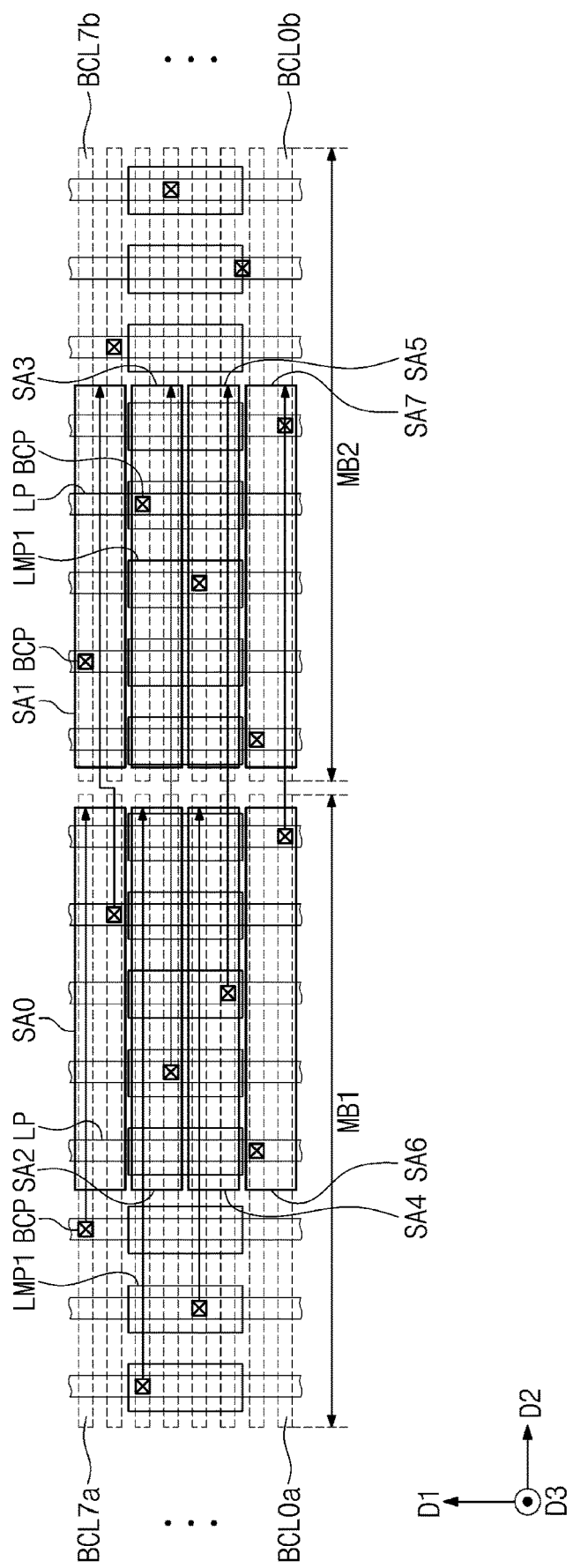
FIG. 10 is a diagram illustrating a connection structure between the cell array structure and the peripheral circuit structure in a region A of FIG. 9.
Figure 11A:
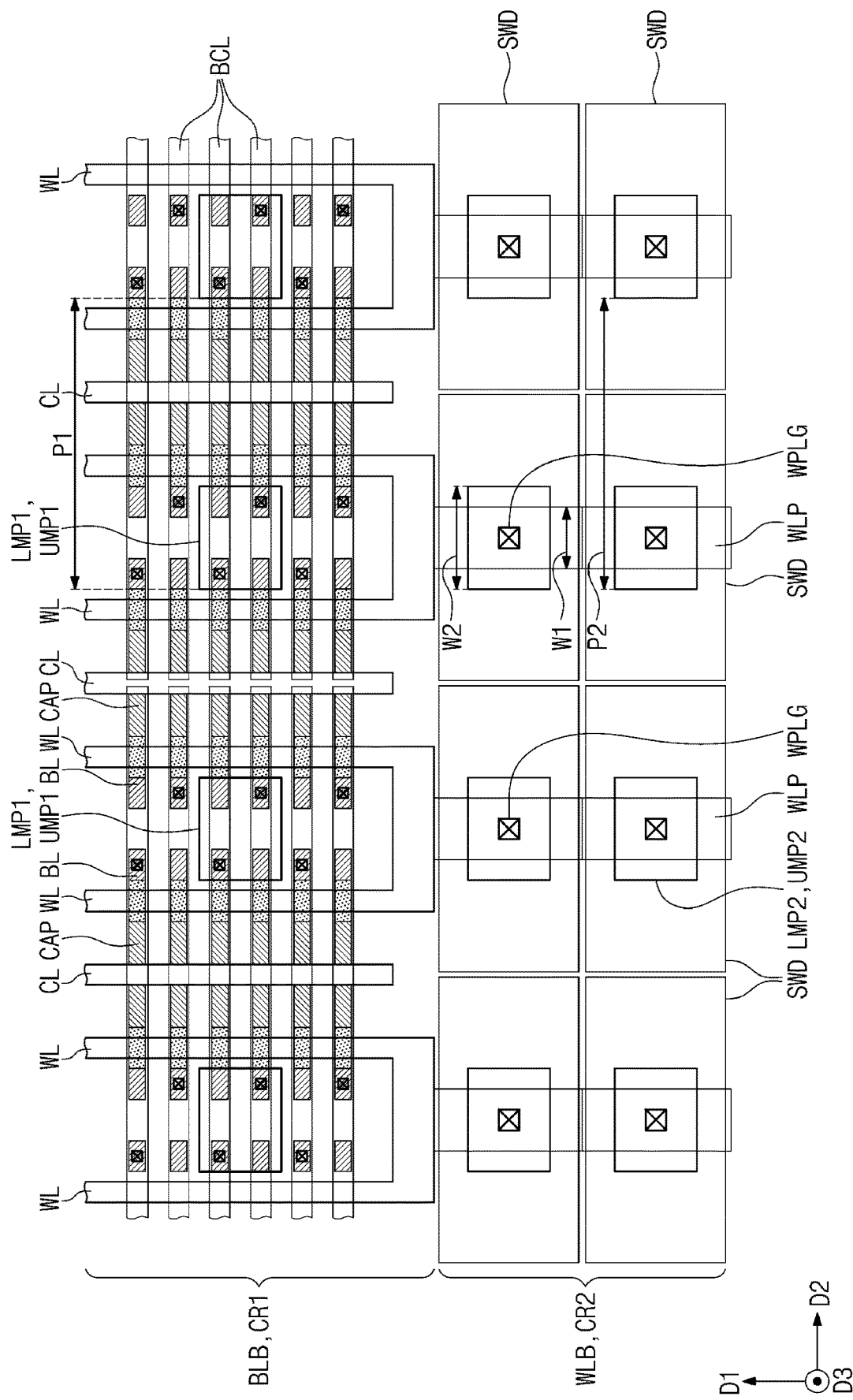
FIGS. 11A and 11B are diagrams illustrating connection structures between the cell array structure and the peripheral circuit structure in a region B of FIG. 9, according to various example embodiments.
Figure 11B:
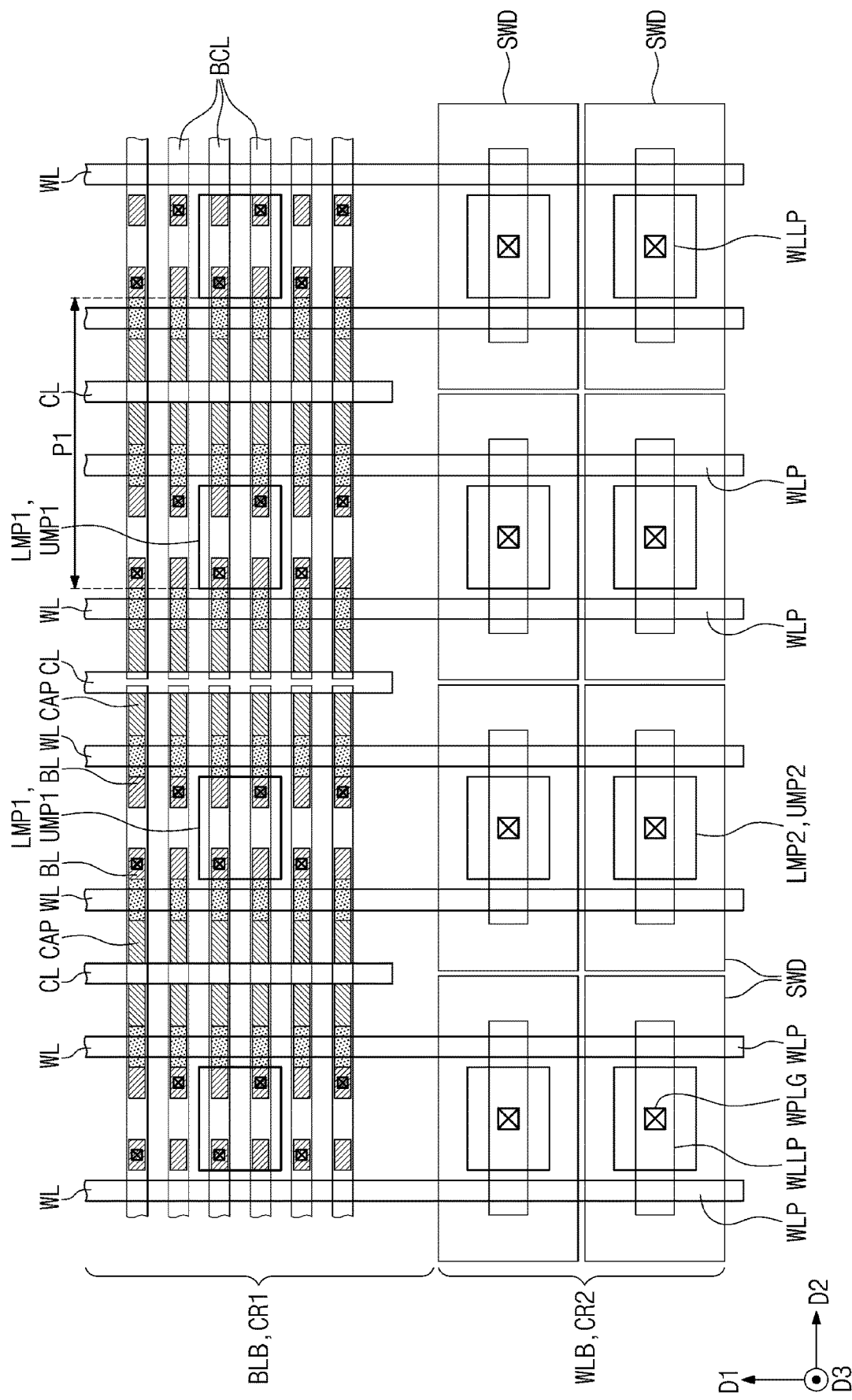

FIG. 9 is a plan view schematically illustrating a three-dimensional semiconductor memory device according to an example embodiment. FIG. 10 is a diagram illustrating a connection structure between the cell array structure and the peripheral circuit structure in a region A of FIG. 9. FIGS. 11A and 11B are diagrams illustrating connection structures between the cell array structure and the peripheral circuit structure in a region B of FIG. 9, according to various example embodiments.

Referring to FIGS. 9, 10, and 11A, the three-dimensional semiconductor memory device according to an example embodiment may include a plurality of memory blocks, which are disposed in the second direction D2. As an example, the three-dimensional semiconductor memory device may include a first memory block MB1 and a second memory block MB2.

Each of the first and second memory blocks MB1 and MB2 may include the cell array structure CS, which includes the bit-line connection region BLB and the word-line connection region WLB, and the peripheral circuit structure PS, which includes the first and second core regions CR1 and CR2, as described above. When viewed in a plan view, the first core region CR1 may be overlapped with the bit-line connection region BLB, and the second core region CR2 may be overlapped with the word-line connection region WLB. In the first core region CR1, sense amplifiers SA may be overlapped with a portion of the bit-line connection region BLB of each of the memory blocks MB1 and MB2, when viewed in a plan view.

The bit lines BL, the bit-line connection lines BCL, the landing conductive patterns LP, and the lower metal pads LMP1 and LMP2 of the cell array structure may be provided in each of the first and second memory blocks MB1 and MB2, as previously described with reference to FIGS. 5, 6A, 6B, 7, and 8. In addition, the upper metal pads UMP1 and UMP2 of the peripheral circuit structure PS may be provided to correspond to the lower metal pads LMP1 and LMP2.

In the bit-line connection region BLB, the first lower and upper metal pads LMP1 and UMP1 may be arranged to be spaced apart from each other by constant distances in the first and second directions D1 and D2. However, this is only an example and in some example embodiments, the distances in the first and second directions D1 and D2 may be varied. In the word-line connection region WLB, the second lower and upper metal pads LMP2 and UMP2 may be arranged to be spaced apart from each other by constant distances in the first and second directions D1 and D2. However, this is only an example and in some example embodiments, the distances in the first and second directions D1 and D2 may be varied. In addition, the first lower and upper metal pads LMP1 and UMP1 may have substantially the same size and area as each other, and the second lower and upper metal pads LMP2 and UMP2 may have substantially the same size and area as each other. In some example embodiments, the size and/or area of some or all of the first lower and upper metal pads LMP1 and UMP1 may be different than a size and/or area of some or all of the second lower and upper metal pads LMP2 and UMP2.

Referring to FIGS. 9 and 10, bit-line connection lines BCL0a-BCL7a of the first memory block MB1 may be spaced apart from bit-line connection lines BCL0b-BCL7b of the second memory block MB2. In other words, the bit-line connection lines BCL0a-BCL7a of the first memory block MB1 may be separated from the bit-line connection lines BCL0b-BCL7b of the second memory block MB2.

As an example, even-numbered sense amplifiers SA0, SA2, SA4, and SA6 may be provided in the first memory block MB1, and odd-numbered sense amplifiers SA1, SA3, SA5, and SA7 may be provided in the second memory block MB2. The bit-line connection lines BCL0a-BCL7a and BCL0b-BCL7b of the first and second memory blocks MB1 and MB2, which are adjacent to each other, may share the sense amplifiers SA0-SA7.

Referring to FIGS. 9 and 11A, as previously described with reference to FIG. 5A, the word line structures of the cell array structure may be provided so that a pair of the word lines WL, which are located at the same level, share a corresponding one of the word-line pads. The number of the word-line pads WLP may be equal to the stacking number of the word lines WL. A sub-word line driver SWD may be provided to correspond to each word-line pad WLP. In other words, the sub-word line drivers SWD may be electrically connected to the word-line pads WLP, respectively, through the second lower and upper metal pads UMP1 and UMP2.

Each of the second lower and upper metal pads UMP1 and UMP2 may have a second width W2 that is larger than a first width W1 of the word-line pad WLP. The first lower and upper metal pads LMP1 and UMP1 may be arranged at a first pitch, and the second lower and upper metal pads LMP2 and UMP2 may be arranged at a second pitch that is substantially the same as the first pitch.

Referring to FIGS. 9 and 11B, in each of the word line structures of the cell array structure, the word-line pads WLP may be provided on the word lines, respectively, as previously described with reference to FIG. 5B. For example, the word-line pads WLP of the word line structures, which are adjacent to each other in the second direction D2, may be spaced apart from each other in the second direction D2. A word-line landing pad WLLP may be provided to correspond to a pair of the word-line pads WLP, which are adjacent to each other in the second direction D2. The number of the word-line landing pads WLLP may be equal to the stacking number of the word lines WL. The word-line landing pads WLLP may be located at substantially the same level as the landing conductive patterns LP described with reference to FIG. 8. The word-line landing pads WLLP may be formed of or include the same conductive material as the landing conductive patterns LP. The word-line landing pads WLLP may be electrically connected to the word-line pads WLP through word line contact plugs WPLG. The sub-word line driver SWD may be provided to correspond to each of the word-line landing pads WLLP.

Figure 12:
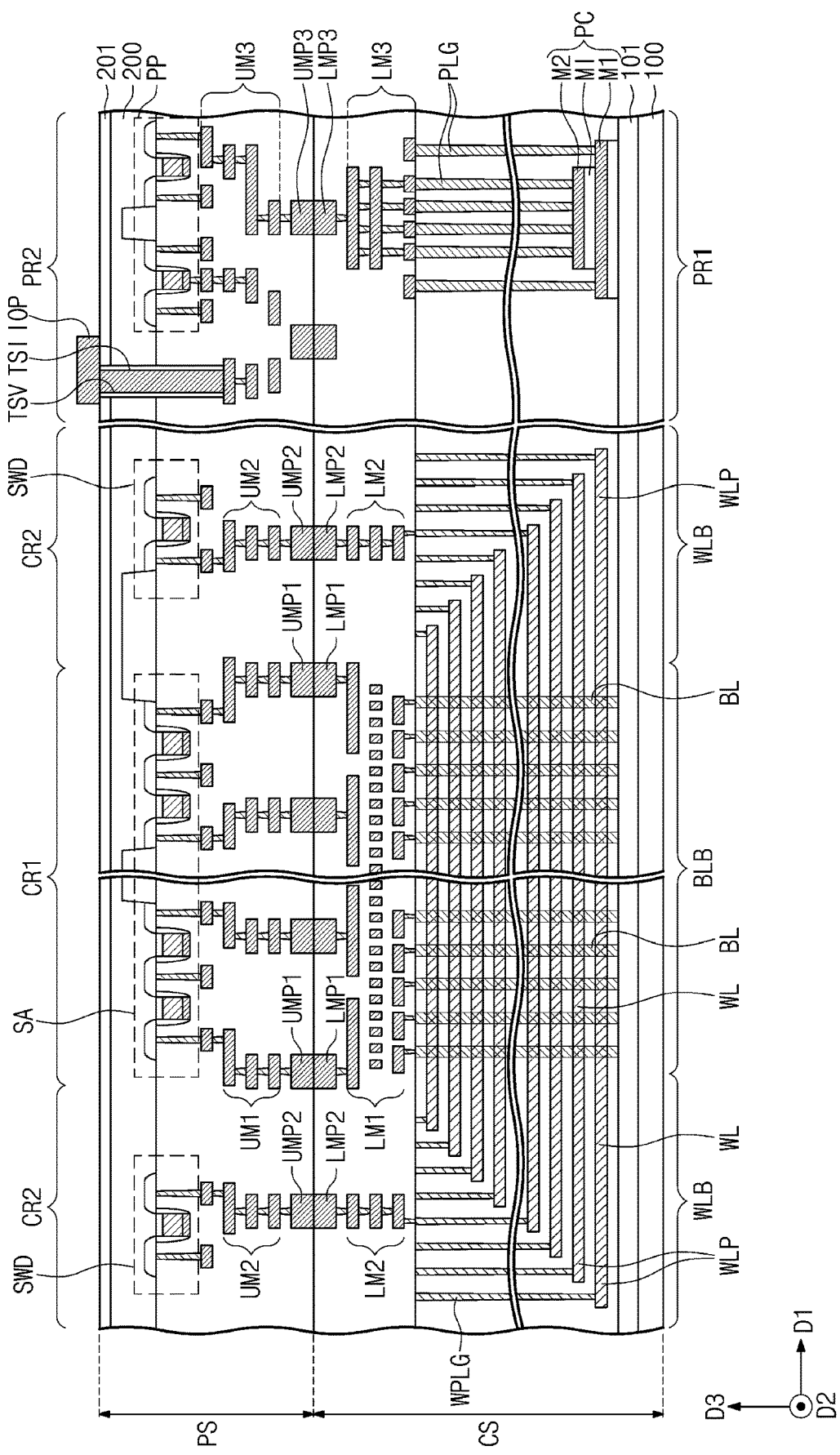
FIGS. 12 to 16 are sectional views illustrating a three-dimensional semiconductor memory device according to various example embodiments.

FIG. 12 is a sectional view illustrating a three-dimensional semiconductor memory device according to an example embodiment.

Referring to FIG. 12, the three-dimensional semiconductor memory device according to an example embodiment may include the cell array structure CS and the peripheral circuit structure PS, as described above. The cell array structure CS may include memory cells, which are three-dimensionally arranged on the first substrate 100, and the peripheral circuit structure PS may include core and peripheral circuits, including sense amplifiers SA, sub-line word drivers SWD, and upper control circuits PP, which are formed on the second substrate 200 and are used to control a memory cell array.

A detailed structure of the memory cell array has been described with reference to FIGS. 5, 6A, 6B, 7, and 8, and thus, only the bit lines BL and the word lines WL of the cell array structure CS are briefly illustrated in FIG. 12.

In detail, the cell array structure CS may include the bit-line connection region BLB, the word-line connection regions WLB, which are provided at both sides of the bit-line connection region BLB, and the first peripheral region PR1.

The word lines WL may be stacked in the third direction D3 that is perpendicular to the top surface of the first substrate 100. The word lines WL may be provided on the bit-line connection region BLB and the word-line connection regions WLB. The word lines WL may be extended in the first direction D1 that is parallel to the top surface of the first substrate 100. Some of the word lines WL may have substantially the same length, when measured in the first direction D1.

The word-line pads WLP may be provided at opposite ends of each of the word lines WL. The word-line pads WLP may be stacked on the first substrate 100 such that they form a staircase structure in the word-line connection regions WLB. The word-line pads WLP may be placed at positions that are horizontally and vertically different from each other.

The bit lines BL may be extended in the third direction D3 to cross the word lines WL in the bit-line connection region BLB. The semiconductor pattern SP (e.g., see FIGS. 5A and 5B) and the capacitor CAP (e.g., see FIGS. 5A and 5B) may be provided at each intersection of the word and bit lines WL and BL. The bit lines BL may have substantially the same length, when measured in the third direction D3.

The bit-line connection line BCL may be coupled to each bit line BL through the bit line contact plug BCP, as described above. A first lower metal pattern LM1 may be disposed on the bit lines BL. Each of the bit lines BL may be electrically connected to the first lower metal pad LMP1 through the first lower metal pattern LM1. The first lower metal pattern LM1 may include at least two metal patterns, which are stacked vertically and are connected to each other. In an example embodiment, the first lower metal pattern LM1 may include the bit-line connection lines BCL and the landing conductive patterns LP described above.

In the word-line connection regions WLB, the word line contact plugs WPLG may be coupled to the word-line pads WLP, respectively. A second lower metal pattern LM2 may be coupled to the word line contact plugs WPLG. The second lower metal pattern LM2 may include at least two metal patterns, which are stacked vertically and are connected to each other. Although the second lower metal pattern LM2 is illustrated to be coupled to one word line contact plug WPLG by way of illustration in order to provide a clear figure, it will be understood that the second lower metal patterns LM2 may be respectively coupled to the word line contact plugs WPLG. Each of the word-line pads WLP may be electrically connected to the second lower metal pad LMP2 via the word line contact plug WPLG and the second lower metal pattern LM2.

In an example embodiment, a power capacitor PC, which is used as a part of a lower control circuit controlling the sense amplifiers and the sub-word line drivers, may be provided in the first peripheral region PR1 of the cell array structure CS. The power capacitor PC may constitute a voltage generator, which receives a power voltage supplied through an input/output pad TOP and outputs operation voltages to operate the memory cell array. In detail, the power capacitor PC may be a metal-insulator-metal (MIM) capacitor, which includes a first electrode M1 and a second electrode M2 on the first substrate 100 and a dielectric layer MI therebetween. A third lower metal pattern LM3 may be coupled to the power capacitor PC, and the third lower metal pattern LM3 may include at least two metal patterns, which are stacked vertically and are connected to each other. The power capacitor PC may be electrically connected to a third lower metal pad LMP3 through the third lower metal pattern LM3.

The first, second, and third lower metal patterns LM1, LM2, and LM3 may be located at substantially the same level and may be formed of or include the same metallic material (hereinafter, a first metallic material). The first, second, and third lower metal pads LMP1, LMP2, and LMP3 may be located at substantially the same level and may be formed of or include the same metallic material (hereinafter, a second metallic material). In some example embodiments, the upper surfaces of the first, second, and third lower metal pads LMP1, LMP2, and LMP3 may be coplanar. The second metallic material may be different from the first metallic material.

The peripheral circuit structure PS may include the core and peripheral circuits SA, SWD, and PP, which are formed on the second substrate 200 and are used to control the memory cell array.

In detail, the peripheral circuit structure PS may include the first core region CR1, the second core region CR2, and the second peripheral region PR2.

The sense amplifiers SA may be provided in the first core region CR1. Each of the sense amplifiers SA may include NMOS and PMOS transistors, which are formed on the second substrate 200, and may be electrically connected to a pair of the bit lines BL. Each sense amplifier SA may be configured to amplify a difference between voltages, which are sensed through the pair of the bit lines BL, and to provide the amplified voltage difference to a pair of local input/output lines.

Each sense amplifier SA may be electrically connected to a first upper metal pattern UM1. The first upper metal pattern UM1 may include at least two metal patterns, which are stacked vertically and are connected to each other. Each sense amplifier SA may be electrically connected to the first upper metal pad UMP1 through the first upper metal pattern UM1.

The sub-word line drivers SWD, which are used to drive the word lines WL, respectively, may be disposed in the second core region CR2. Each of the sub-word line drivers SWD may include NMOS and PMOS transistors. A second upper metal pattern UM2 may be electrically connected to each of the sub-word line drivers SWD.

Each of the sub-word line drivers SWD may be electrically connected to the second upper metal pattern UM2. The second upper metal pattern UM2 may include at least two metal patterns, which are stacked vertically and are connected to each other. Each of the sub-word line drivers SWD may be electrically connected to the second upper metal pad UMP2 through the second upper metal pattern UM2.

Furthermore, the upper control circuits PP to control the sub-word line drivers SWD and the sense amplifiers SA may be disposed in in the second peripheral region PR2 of the peripheral circuit structure PS. The upper control circuits PP may be electrically connected to a third upper metal pattern UM3. The third upper metal pattern UM3 may include at least two metal patterns, which are stacked vertically and are connected to each other. The upper control circuits PP may be electrically connected to third upper metal pads UMP3 through the third upper metal pattern UM3.

The input/output pad TOP may be disposed in the second peripheral region PR2 of the peripheral circuit structure PS. In detail, a passivation layer 201 may be disposed on a bottom surface of the second substrate 200, and the input/output pad TOP may be disposed on the passivation layer 201. The input/output pad TOP may be coupled to a portion of the third upper metal pattern UM3 through a penetration plug TSV penetrating the second substrate 200. A sidewall insulating layer TSI may be disposed between a sidewall of the penetration plug TSV and the second substrate 200. The input/output pad TOP may be electrically connected to the upper control circuits PP through the penetration plug TSV and the third upper metal pattern UM3.

The first, second, and third upper metal patterns UM1, UM2, and UM3 may be located at substantially the same level and may be formed of or include the same metallic material (hereinafter, a first metallic material). The first, second, and third upper metal pads UMP1, UMP2, and UMP3 may be located at substantially the same level and may be formed of or include the same metallic material (hereinafter, a second metallic material). In some example embodiments, lower surfaces of the first, second, and third upper metal pads UMP1, UMP2, and UMP3 may be coplanar. The second metallic material may be different from the first metallic material.

The first, second, and third upper metal pads UMP1, UMP2, and UMP3 may be in direct contact with the first, second, and third lower metal pads LMP1, LMP2, and LMP3. The first, second, and third upper metal pads UMP1, UMP2, and UMP3 may be formed of or include the same metallic material as the first, second, and third lower metal pads LMP1, LMP2, and LMP3. The first, second, and third upper metal pads UMP1, UMP2, and UMP3 may have substantially the same width or the same area as the first, second, and third lower metal pads LMP1, LMP2, and LMP3.

FIGS. 13 to 16 are sectional views illustrating a three-dimensional semiconductor memory device according to various example embodiments. For concise description, an element previously described with reference to FIG. 12 may be identified by the same reference number without repeating an overlapping description thereof for conciseness.

Figure 13:
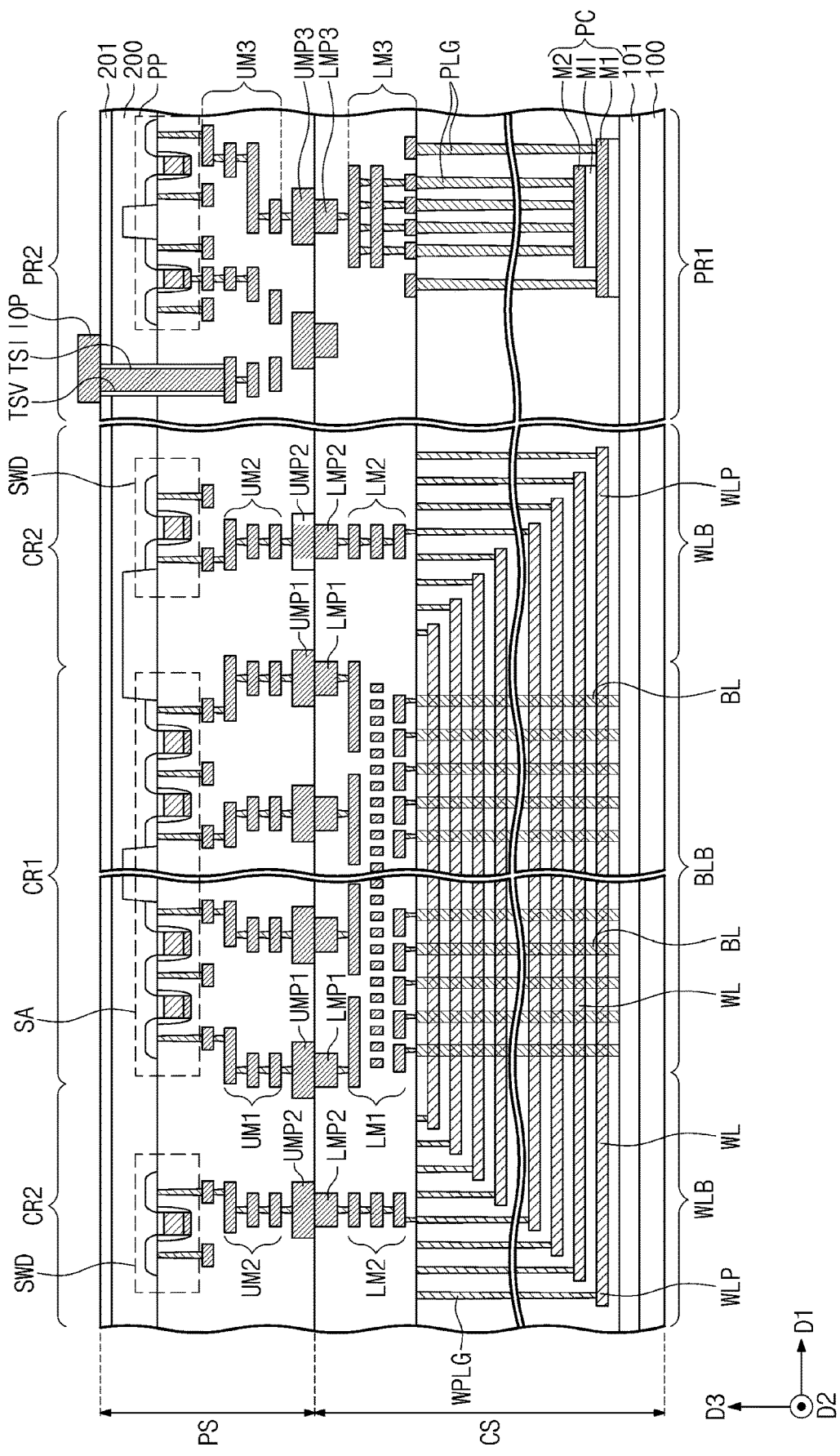

Referring to FIG. 13, the first, second, and third lower metal pads LMP1, LMP2, and LMP3 of the cell array structure CS may have different sizes from the first, second, and third upper metal pads UMP1, UMP2, and UMP3. As an example, the sizes of the first, second, and third lower metal pads LMP1, LMP2, and LMP3 may be smaller than the sizes of the first, second, and third upper metal pads UMP1, UMP2, and UMP3.

Figure 14:
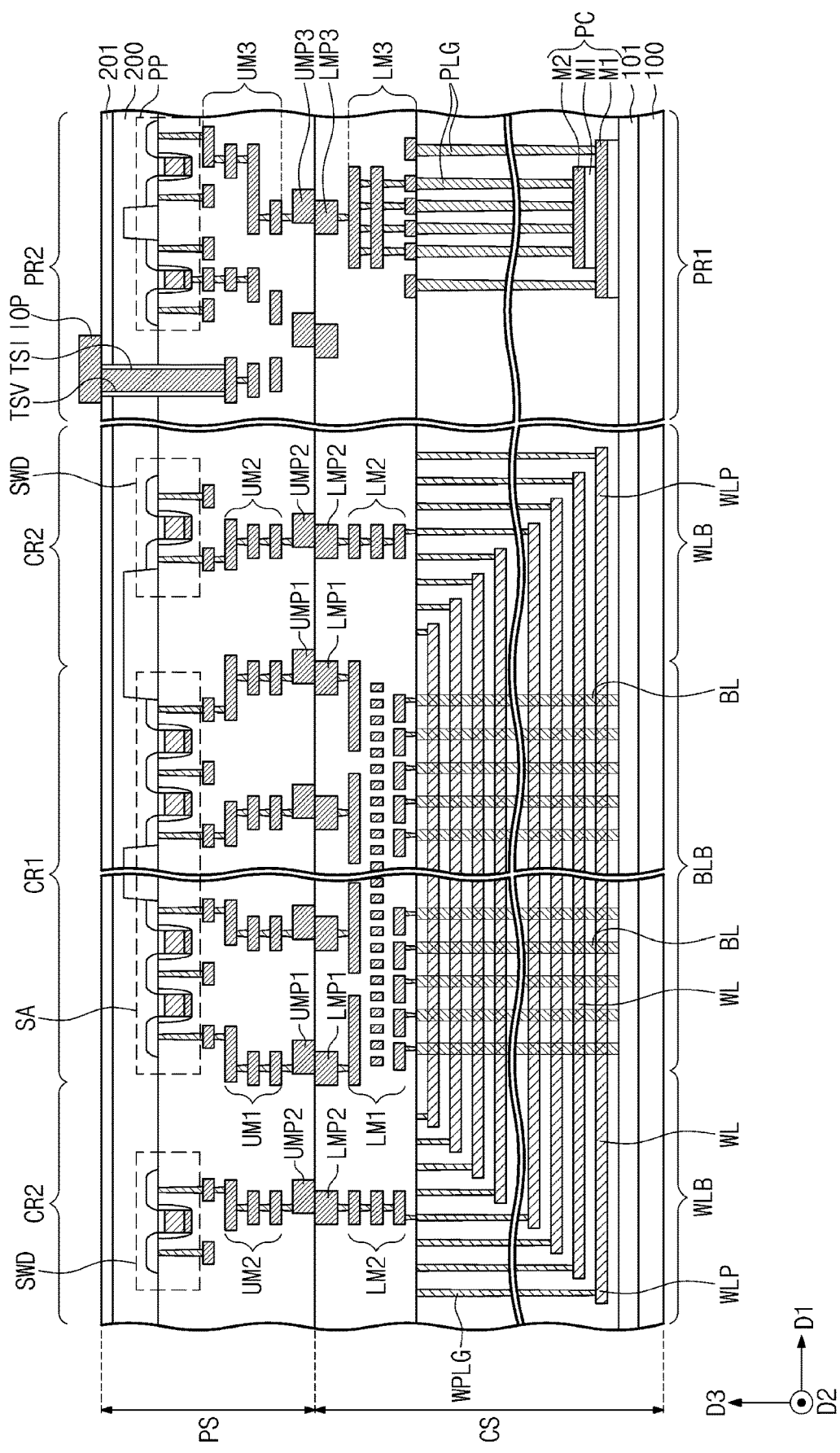

Referring to FIG. 14, the cell array structure CS may be bonded to the peripheral circuit structure PS in such a way that the first, second, and third lower metal pads LMP1, LMP2, and LMP3 are slightly misaligned from the first, second, and third upper metal pads UMP1, UMP2, and UMP3. For example, portions of the first, second, and third lower metal pads LMP1, LMP2, and LMP3 may be in direct contact with portions of the first, second, and third upper metal pads UMP1, UMP2, and UMP3.

Figure 15:
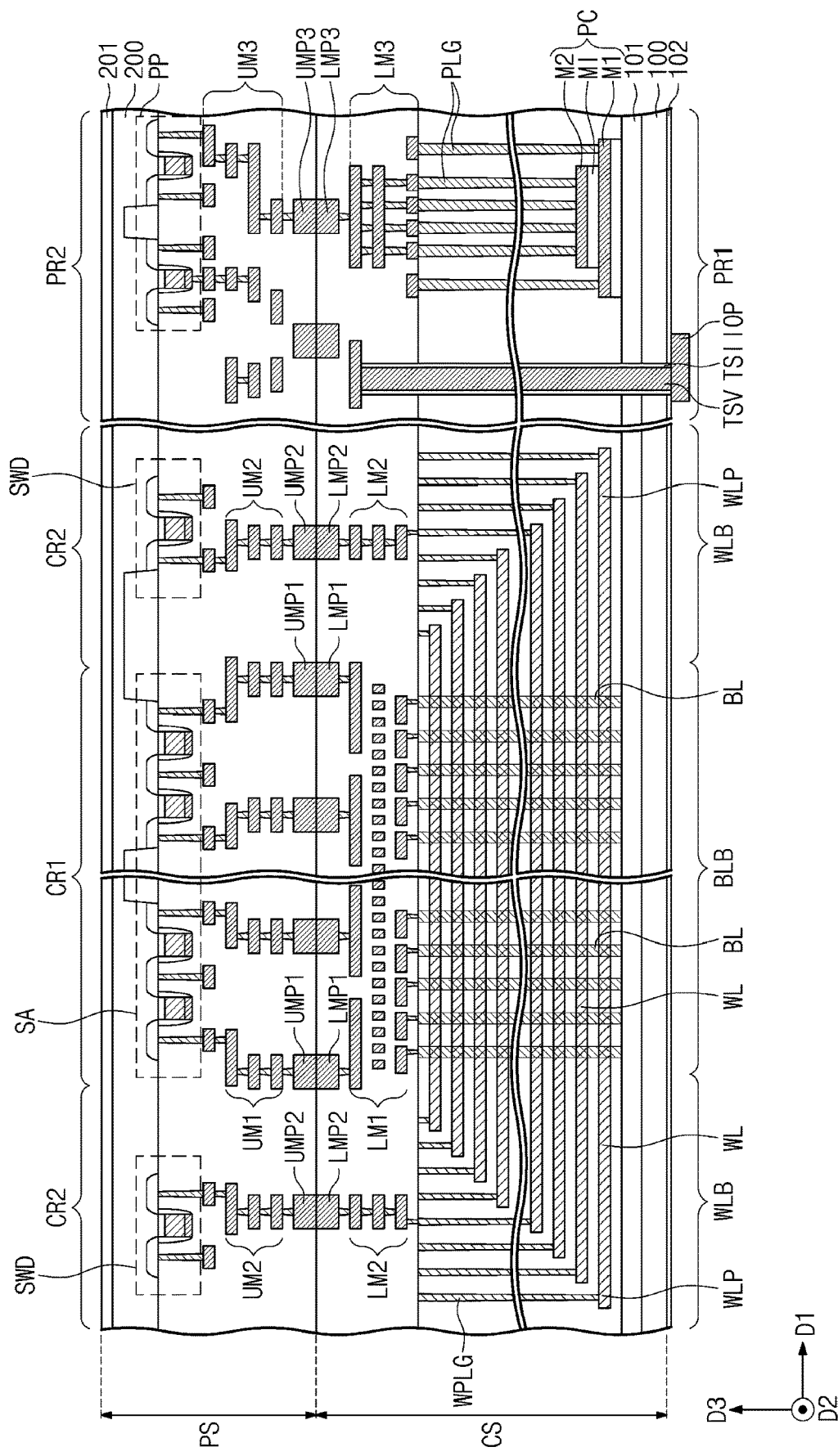

Referring to FIG. 15, the input/output pad IOP may be disposed in the first peripheral region PR1 of the cell array structure CS. In detail, a passivation layer 102 may be disposed on a bottom surface of the first substrate 100, and the input/output pad IOP may be disposed on the passivation layer 102. The input/output pad IOP may be coupled to a portion of the third lower metal pattern LM3 through the penetration plug TSV penetrating the first substrate 100. The sidewall insulating layer TSI may be disposed between a sidewall of the penetration plug TSV and the first substrate 100. The input/output pad IOP may be electrically connected to the lower control circuits (e.g., the power capacitor PC) through the penetration plug TSV and the third lower metal pattern LM3.

Figure 16:
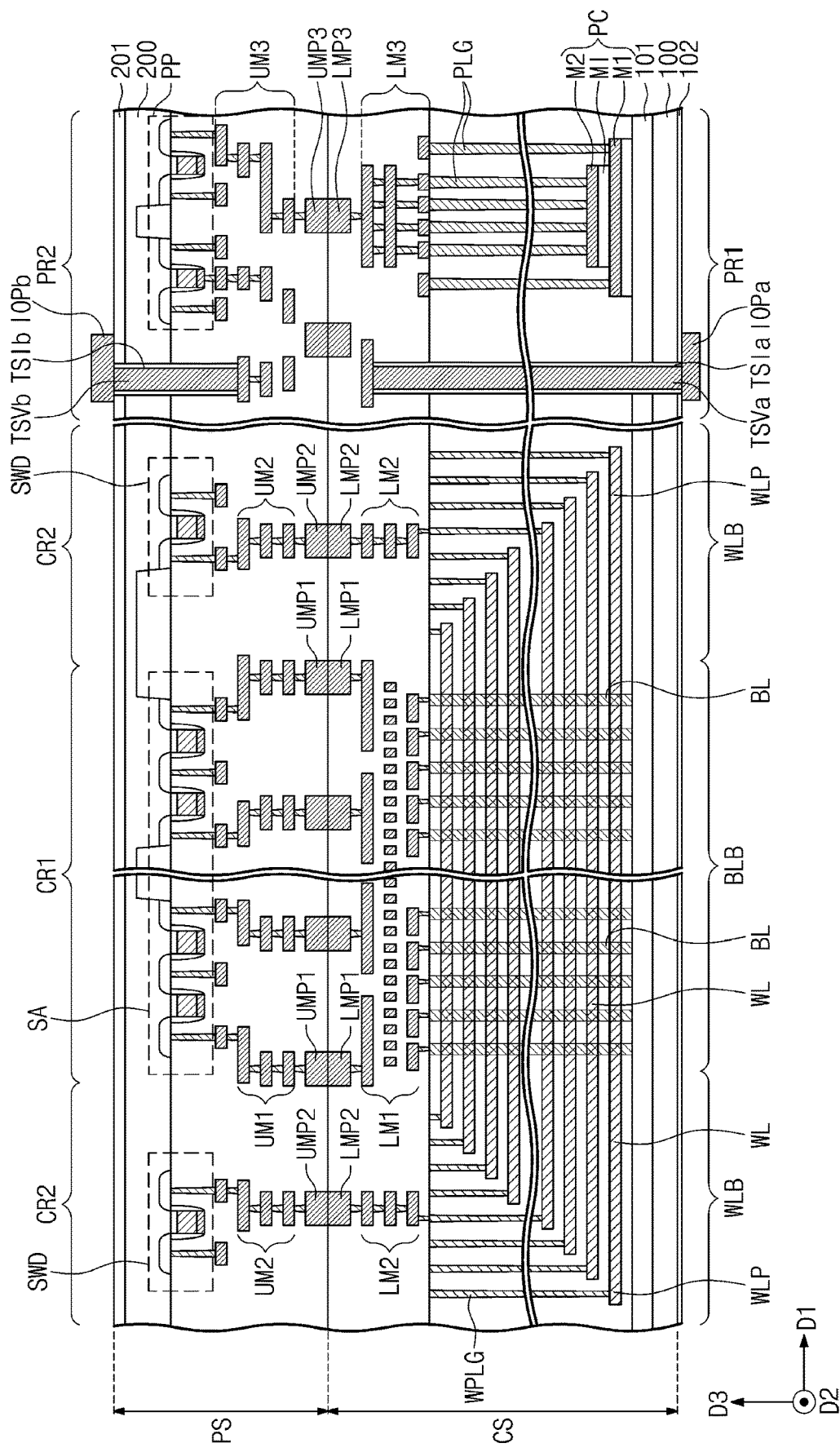

Referring to FIG. 16, a lower input/output pad IOPa may be disposed on a rear surface of the first substrate 100 and in the first peripheral region PR1. An upper input/output pad IOPb may be disposed on a rear surface of the second substrate 200 and in the second peripheral region PR2.

A lower penetration plug TSVa may be provided to penetrate the first substrate 100 and to connect the third lower metal pattern LM3 to the lower input/output pad IOPa. The upper penetration plug TSVb may be provided to penetrate the second substrate 200 and to connect the third upper metal pattern UM3 to the upper input/output pad IOPb. A lower sidewall insulating layer TSIa may be provided to enclose a sidewall of the lower penetration plug TSVa, and an upper sidewall insulating layer TSIb may be provided to enclose a sidewall of the upper penetration plug TSVb.

In the example embodiments described with reference to FIGS. 12 to 16, the power capacitor PC is illustrated to be provided on the first substrate 100, but example embodiments are not limited to this example. For example, in some example embodiments, the power capacitor PC may be provided on the second substrate 200, and the peripheral circuit PP may be provided on the first substrate 100.

FIGS. 17 to 22 are diagrams illustrating an example of lower and upper metal pads that are arranged in a three-dimensional semiconductor memory device according to various example embodiments. FIGS. 17 to 22 illustrate examples of second lower and upper metal pads, which are arranged in the word-line connection region of the three-dimensional semiconductor memory device according to an example embodiment. Although only the word-line connection region is illustrated in FIGS. 17 to 22, the first lower and upper metal pads in the bit-line connection region may be provided to have a similar arrangement to the second lower and upper metal pads to be described with reference to FIGS. 17 to 22.

In detail, referring to FIGS. 17 to 22, the word-line pads WLP may be arranged to form a stepwise structure in the word-line connection region WLB, as previously described with reference to FIG. 12. The word-line pads WLP may be arranged in the first direction D1 and may be spaced apart from each other in the second direction D2, when viewed in a plan view. The word line contact plugs WPLG may be coupled to the word-line pads WLP, respectively.

Figure 19:
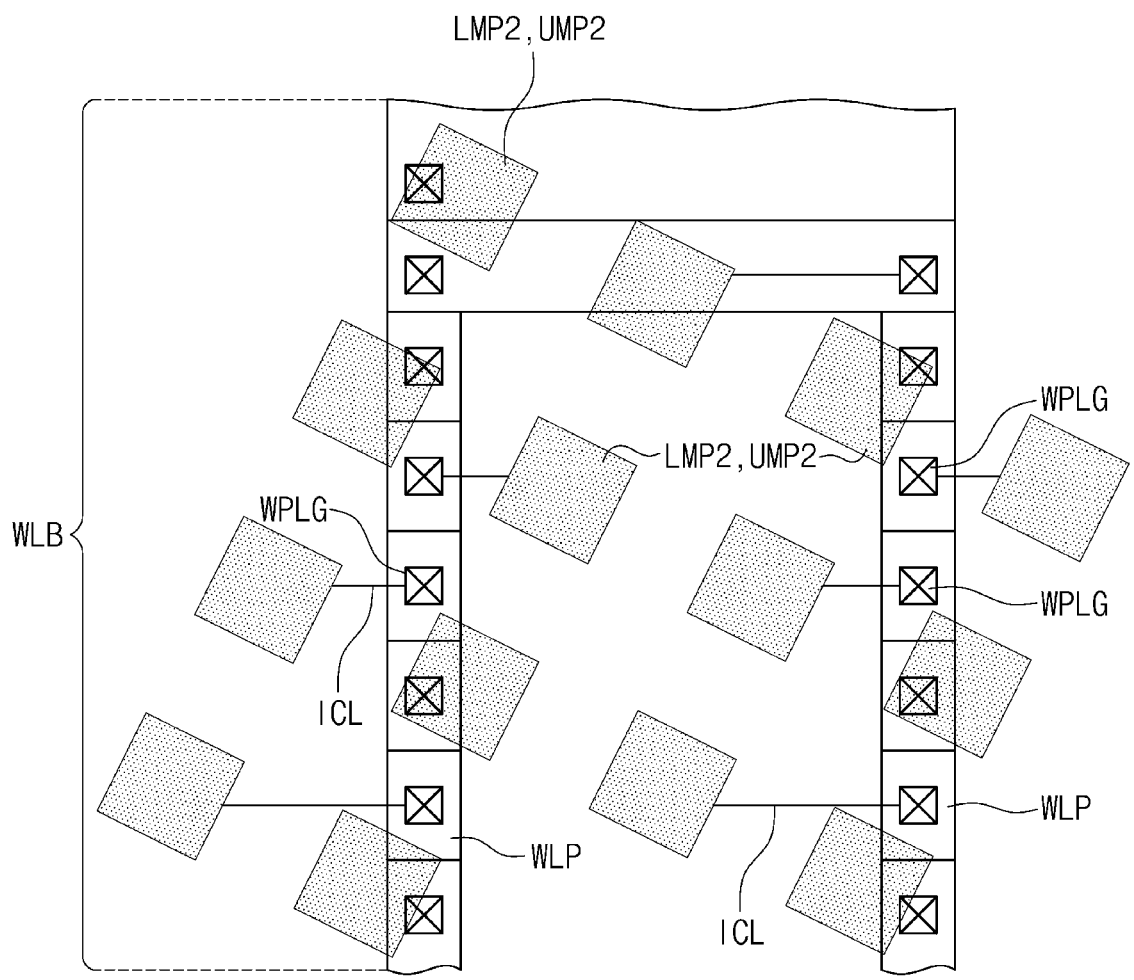

As described above, the second lower and upper metal pads LMP2 and UMP2 may be electrically connected to the word-line pads WLP, respectively, through the word line contact plugs WPLG. In some example embodiments, the second lower and upper metal pads LMP2 and UMP2 may be connected to the word line contact plugs WPLG in a one-to-one manner. However, in other example embodiments, some the second lower and upper metal pads LMP2 and UMP2 may be connected to multiple word line contact plugs WPLG, as illustrated in FIG. 19. An area of each of the second lower and upper metal pads LMP2 and UMP2 may be larger than an area of the word line contact plug WPLG.

Figure 17:
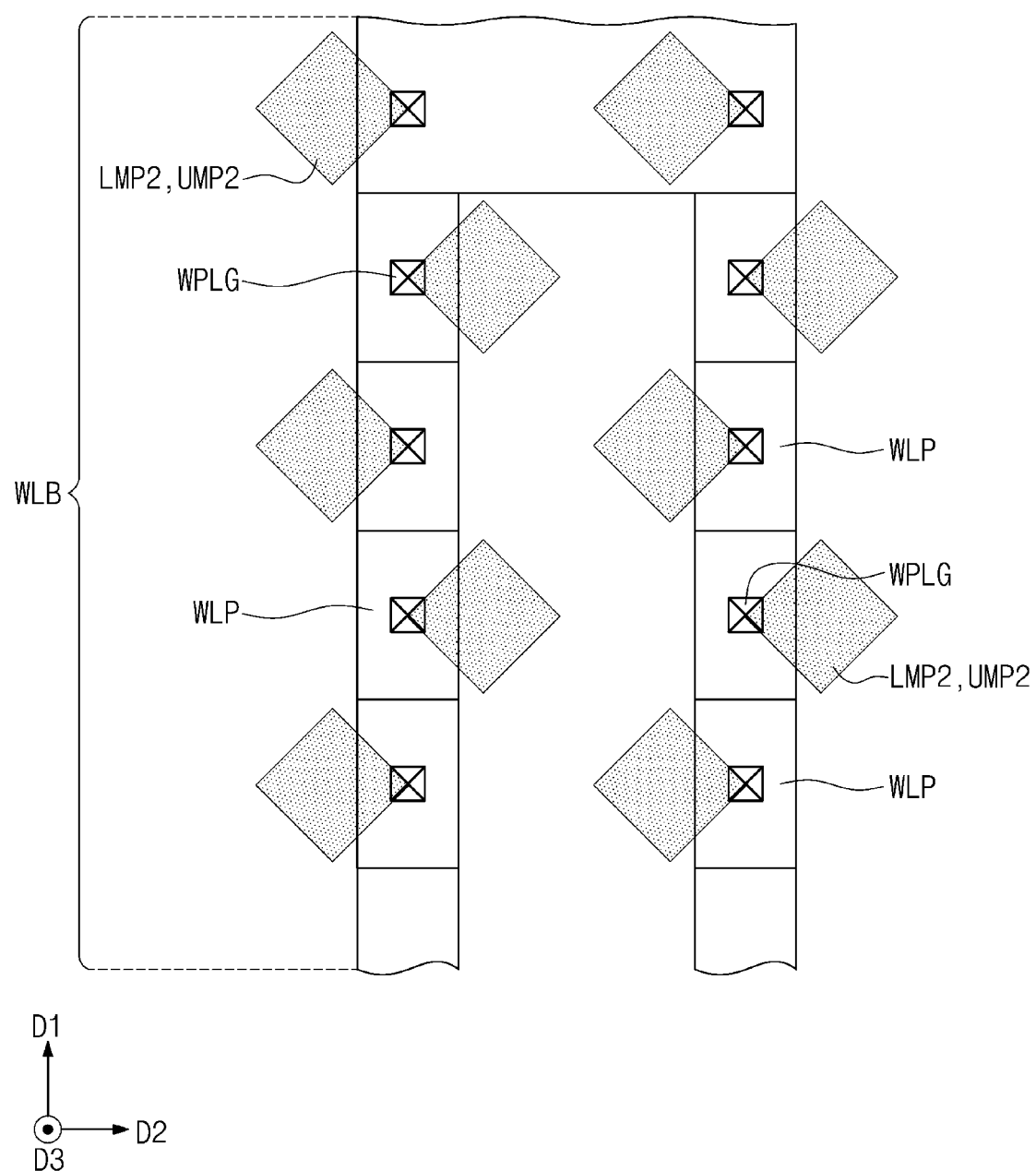
FIGS. 17 to 22 are diagrams illustrating an example of lower and upper metal pads that are arranged in a three-dimensional semiconductor memory device according to various example embodiments.
Figure 18:
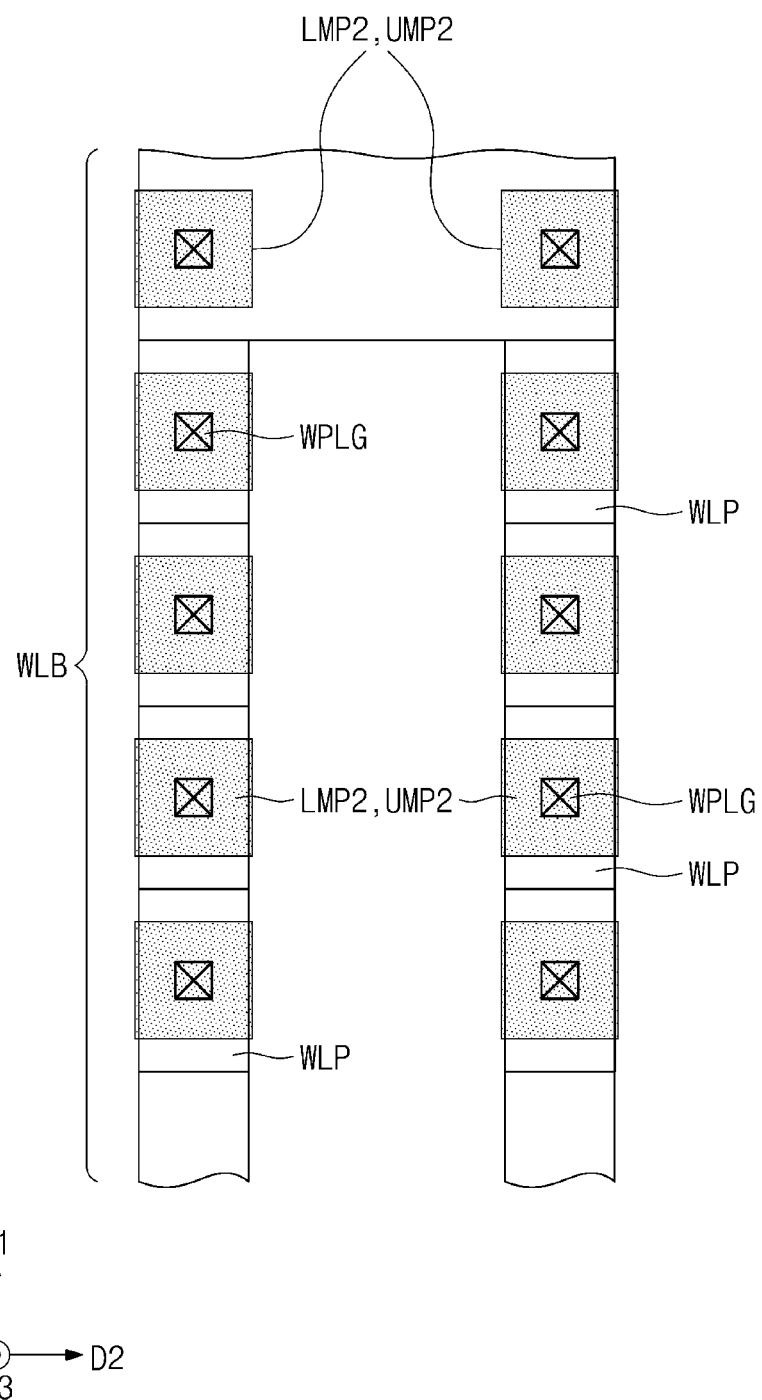
Figure 20:
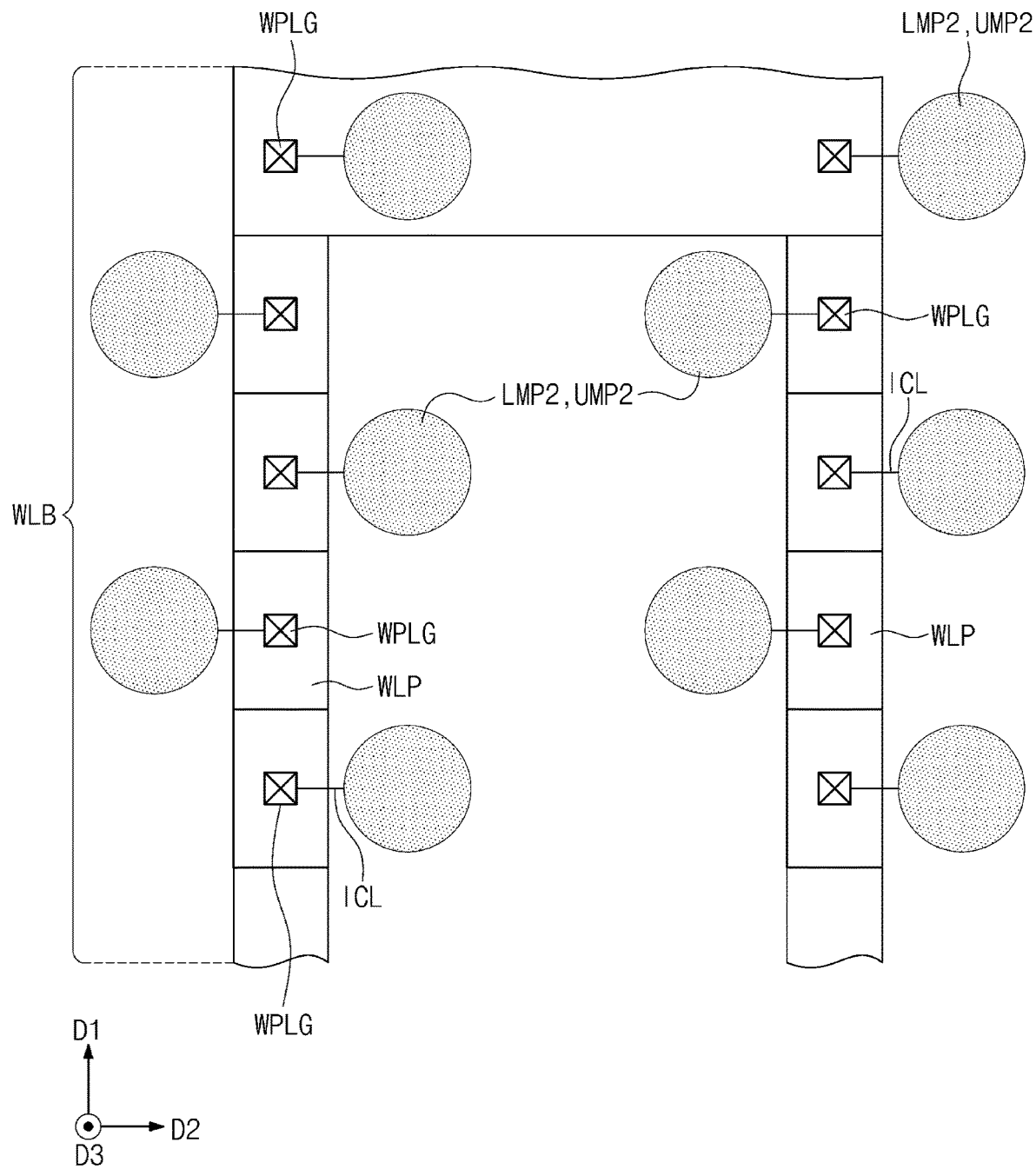
Figure 21:
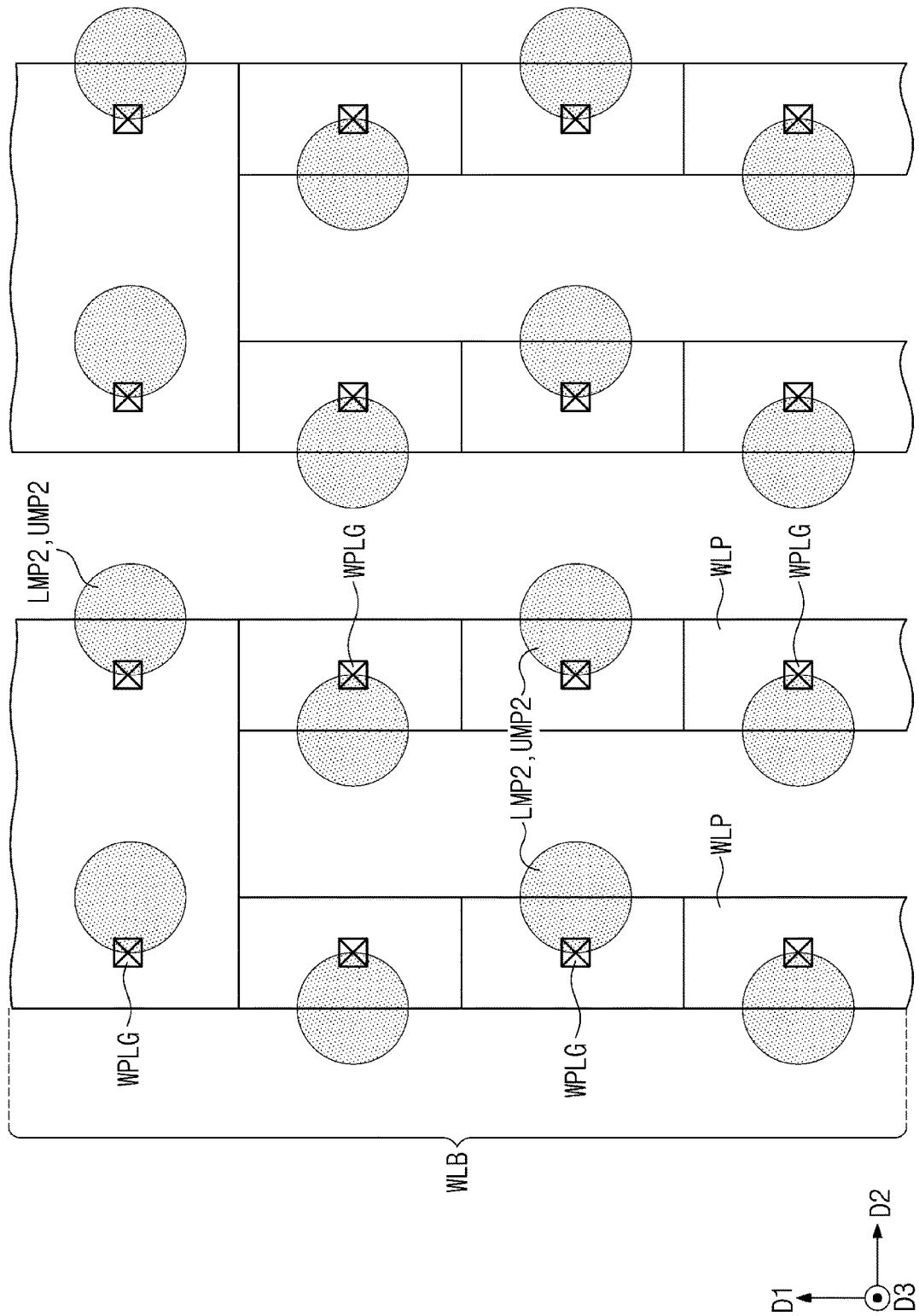
Figure 22:
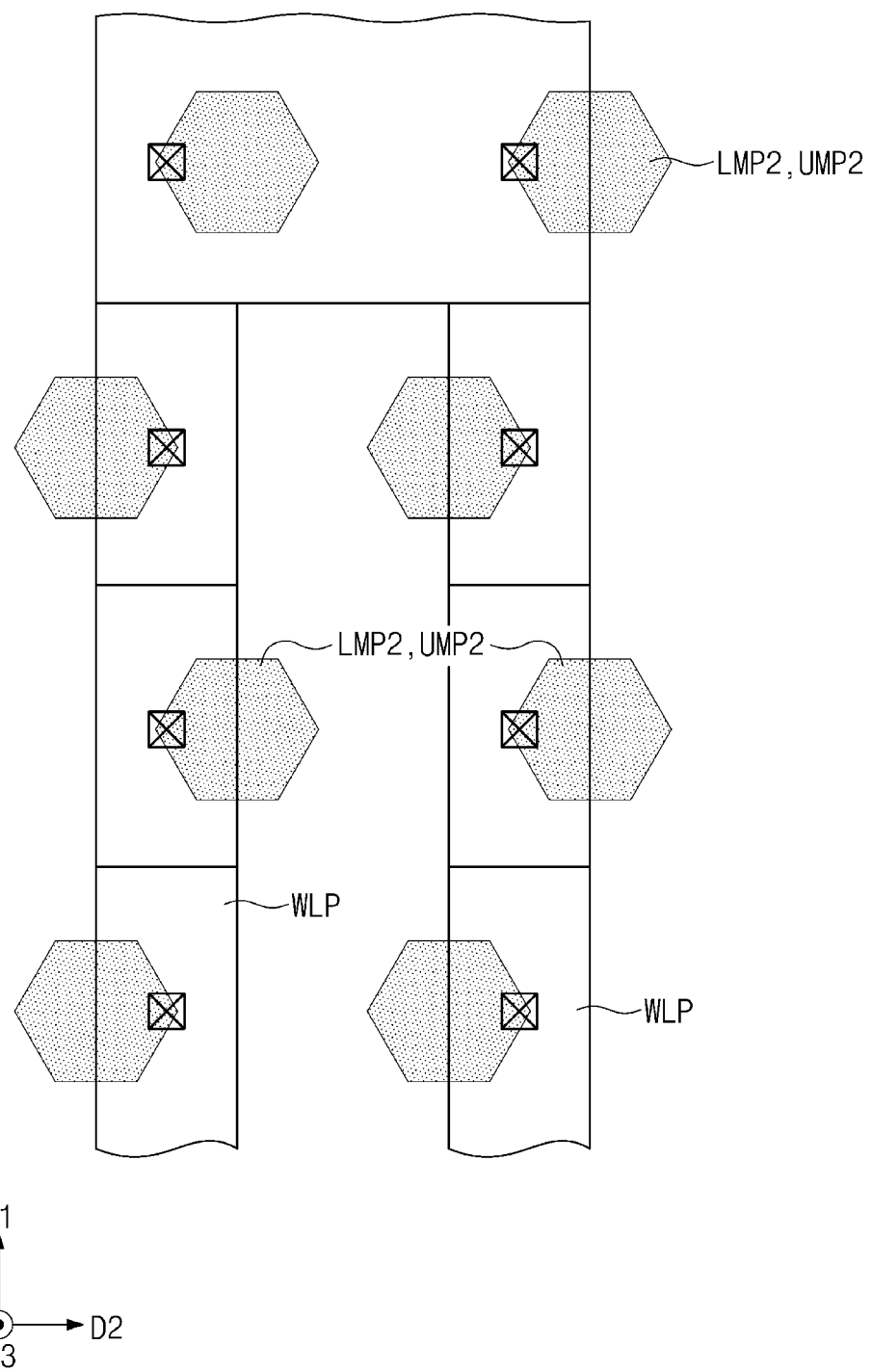

Each of the second lower and upper metal pads LMP2 and UMP2 may have a square or rectangular shape, as shown in FIGS. 17, 18, and 19. Alternatively, each of the second lower and upper metal pads LMP2 and UMP2 may have a circular shape, as shown in FIGS. 20 and 21. Alternatively, each of the second lower and upper metal pads LMP2 and UMP2 may have a hexagonal shape, as shown in FIG. 22.

Referring to FIG. 17, when viewed in a plan view, the word line contact plugs WPLG may be arranged to be spaced apart from each other in the first and second directions D1 and D2, and the second lower and upper metal pads LMP2 and UMP2 may be arranged to be spaced apart from each other in a direction, which is diagonal to the first and second directions D1 and D2. Portions of the second lower and upper metal pads LMP2 and UMP2 may be in contact with the word line contact plugs WPLG, respectively.

Referring to FIG. 18, the second lower and upper metal pads LMP2 and UMP2 may be provided to have substantially the same arrangement as the word line contact plugs WPLG. In other words, the second lower and upper metal pads LMP2 and UMP2 may be arranged to be spaced apart from each other in the first and second directions D1 and D2, and a distance between the second lower and upper metal pads LMP2 and UMP2 may be smaller than a distance between the word line contact plugs WPLG.

Referring to FIG. 19, the second lower and upper metal pads LMP2 and UMP2 may be arranged to be spaced apart from each other in a direction, which is diagonal to the first and second directions D1 and D2. Some of the second lower and upper metal pads LMP2 and UMP2 may not be overlapped with the word line contact plugs WPLG. Such ones of the second lower and upper metal pads LMP2 and UMP2, which are not overlapped with the word line contact plugs WPLG, may be connected to with the word line contact plugs WPLG through interconnection lines ICL.

Referring to FIG. 20, the second lower and upper metal pads LMP2 and UMP2 may be arranged in a honeycomb shape but may not be overlapped with the word line contact plugs WPLG, when viewed in a plan view. The second lower and upper metal pads LMP2 and UMP2 may be electrically connected to the word line contact plugs WPLG, respectively, through interconnection lines ICL.

Referring to FIG. 21, the second lower and upper metal pads LMP2 and UMP2 may be arranged in a honeycomb shape, and portions of the second lower and upper metal pads LMP2 and UMP2 may be coupled to the word line contact plugs WPLG, respectively, when viewed in a plan view.

Referring to FIG. 22, each of the second lower and upper metal pads LMP2 and UMP2 may be provided to have a hexagonal shape. The second lower and upper metal pads LMP2 and UMP2 may be arranged in a direction, which is diagonal to the first and second directions D1 and D2, and portions of the second lower and upper metal pads LMP2 and UMP2 may be coupled to the word line contact plugs WPLG, respectively.

According to various example embodiments, a bit-line connection region of a cell array structure may be vertically overlapped with a first core region of a peripheral circuit structure, and a word-line connection region of the cell array structure may be vertically overlapped with a second core region of the peripheral circuit structure. Accordingly, it may be possible to shorten signal transmission paths between bit lines and sense amplifiers and between word lines and word line drivers.

Memory cells on a first substrate and core and peripheral circuits on a second substrate may be separately fabricated, and then the first substrate may be bonded to the second substrate. Accordingly, it may be possible to increase an integration density of a three-dimensional semiconductor memory device, to reduce thermal budget, which are applied on the core and peripheral circuits during a process of forming the memory cells, and to reduce sizes of transistors.

In addition, control circuits may be vertically disposed at a side of the first substrate including the memory cells and at a side of the second substrate including the core and peripheral circuits, and thus, an area occupied by the control circuits may be reduced.

While various example embodiments have been particularly shown and described, it will be understood by one of ordinary skill in the art that variations in form and detail may be made therein without departing from the spirit and scope of the attached claims.

What is claimed is:

1. A three-dimensional semiconductor memory device comprising:
a first substrate including a bit-line connection region and a word-line connection region;
a cell array structure on the first substrate,
a second substrate including a first core region and a second core region, which are respectively overlapped with the bit-line connection region and the word-line connection region; and
a peripheral circuit structure on the second substrate, wherein the cell array structure comprises:
word lines stacked on the first substrate;
bit lines crossing the word lines in a first direction perpendicular to a top surface of the first substrate;
first lower metal pads provided on the bit-line connection region and connected to the bit lines; and
second lower metal pads provided on the word-line connection region and connected to the word lines;
wherein the peripheral circuit structure comprises:
sense amplifiers provided on the first core region;
sub-word line drivers provided on the second core region;
first upper metal pads provided on the first core region and connected to the sense amplifiers; and
second upper metal pads provided on the second core region and connected to the sub-word line drivers,
wherein the first lower metal pads are bonded to the first upper metal pads, and
the second lower metal pads are bonded to the second upper metal pads.

2. The three-dimensional semiconductor memory device of claim 1, wherein the cell array structure further comprises memory cells, which are respectively provided at intersections of the word lines and the bit lines,
each of the memory cells comprises a cell transistor and a capacitor, which is connected to an end of the cell transistor,
the cell transistor comprises a semiconductor pattern parallel to the top surface of the first substrate, and
the capacitor is connected to an end of the semiconductor pattern and comprises a storage electrode parallel to the top surface of the first substrate.

3. The three-dimensional semiconductor memory device of claim 1, wherein the word lines are extended in a second direction parallel to the top surface of the first substrate, and
the bit lines are arranged to be spaced apart from each other in the second direction and a third direction crossing the first direction and the second direction.

4. The three-dimensional semiconductor memory device of claim 3, wherein the cell array structure further comprises bit-line connection lines provided between the bit lines and the first lower metal pads, when viewed in a vertical view,
the bit-line connection lines are extended in the third direction and are parallel to each other, and
each of the bit-line connection lines is connected the bit lines arranged in the third direction.

5. The three-dimensional semiconductor memory device of claim 4, wherein each of the first lower metal pads is overlapped with at least two of the bit-line connection lines, when viewed in a plan view.

6. The three-dimensional semiconductor memory device of claim 4, wherein the cell array structure further comprises landing conductive patterns provided between the bit-line connection lines and the first lower metal pads, when viewed in the vertical view, and
the landing conductive patterns are extended in the first direction to cross at least two of the bit-line connection lines.

7. The three-dimensional semiconductor memory device of claim 6, wherein each of the landing conductive patterns is connected to a corresponding one of the bit-line connection lines.

8. The three-dimensional semiconductor memory device of claim 6, wherein, when measured in the first direction, each of the first lower metal pads has a first width and each of the landing conductive patterns has a second width, and the first width is larger than the second width.

9. The three-dimensional semiconductor memory device of claim 1, wherein the word lines are extended in a second direction parallel to the top surface of the first substrate, each of the word lines has a word-line pad on the word-line connection region, the plurality of word-line pads are stacked to form a staircase structure on the word-line connection region, and the second lower metal pads are connected to the plurality of word-line pads.

10. The three-dimensional semiconductor memory device of claim 9, wherein word-line pads, which are located at a same level from the first substrate from among the plurality of word-line pads, are spaced apart from each other in a third direction crossing the second direction, and when measured in the third direction, each of the plurality of word-line pads has a first width and each of the second lower metal pads has a second width, which is larger than the first width.

11. A three-dimensional semiconductor memory device comprising:

a first substrate including a bit-line connection region, a word-line connection region, and a first peripheral region;

a cell array structure including a memory cell array, which includes memory cells three-dimensionally arranged on the bit-line connection region and the word-line connection region of the first substrate, and the cell array structure including lower control circuits, which are provided on the first peripheral region of the first substrate;

a second substrate including a first core region, a second core region, and a second peripheral region, which are overlapped with the bit-line connection region, the word-line connection region, and the first peripheral region, respectively; and a peripheral circuit structure including sense amplifiers provided on the first core region of the second substrate, sub-word line drivers provided on the second core region of the second substrate, and upper control circuits provided on the second peripheral region of the second substrate.

12. The three-dimensional semiconductor memory device of claim 11, wherein the cell array structure comprises lower metal pads and the peripheral circuit structure comprises upper metal pads, and the cell array structure is bonded to the peripheral circuit structure by bonding between the lower metal pads and the upper metal pads.

13. The three-dimensional semiconductor memory device of claim 11, wherein the cell array structure comprises first lower metal pads connected to bit lines of the memory cell array, second lower metal pads connected to word lines of the memory cell array, and third lower metal pads connected to the lower control circuits, the peripheral circuit structure comprises first upper metal pads connected to the sense amplifiers, second upper metal pads connected to the sub-word line drivers, and third upper metal pads connected to the upper control circuits, and the first lower metal pads, the second lower metal pads, and the third lower metal pads are bonded to the first upper metal pads, the second upper metal pads, and the third upper metal pads, respectively.

14. The three-dimensional semiconductor memory device of claim 11, wherein at least one of the upper control circuits and the lower control circuits comprises a power capacitor.

15. The three-dimensional semiconductor memory device of claim 11, further comprising:

a penetration plug that penetrates the first substrate, on the first peripheral region; and an input/output pad disposed on an outside surface of the first substrate and coupled to the penetration plug.

16. The three-dimensional semiconductor memory device of claim 11, further comprising:

a penetration plug that penetrates the second substrate, on the second peripheral region; and an input/output pad disposed on an outside surface of the second substrate and coupled to the penetration plug.

17. A three-dimensional semiconductor memory device comprising:

a first substrate including a bit-line connection region, a word-line connection region, and a first peripheral region;

a cell array structure on the first substrate, the cell array structure comprising:

bit lines, which are extended in a first direction perpendicular to a top surface of the first substrate, word lines, which are extended in a second direction to cross the bit lines, memory cells, which are provided at intersections of the bit lines and the word lines, first lower metal pads, which are provided on the bit-line connection region and are connected to the bit lines, second lower metal pads, which are provided on the word-line connection region and are connected to the word lines, and third lower metal pads, which are provided on the first peripheral region and are connected to lower control circuits;

a second substrate including a first core region, a second core region, and a second peripheral region, which are overlapped with the bit-line connection region, the word-line connection region, and the first peripheral region, respectively; and a peripheral circuit structure on the second substrate, the peripheral circuit structure comprising:

first upper metal pads provided on the first core region and connected to sense amplifiers, second upper metal pads provided on the second core region and connected to sub-word line drivers, and third upper metal pads provided on the second peripheral region and connected to upper control circuits, wherein the first lower metal pads are bonded to the first upper metal pads, the second lower metal pads are bonded to the second upper metal pads, and the third lower metal pads are bonded to the third upper metal pads.

18. The three-dimensional semiconductor memory device of claim 17, wherein at least one of the upper control circuits and the lower control circuits comprises a power capacitor.

19. The three-dimensional semiconductor memory device of claim 17, wherein the peripheral circuit structure further comprises:

a penetration plug, which is provided to penetrate the second substrate on the second peripheral region and is electrically connected to the upper control circuits, a sidewall insulating layer, which covers a sidewall of the penetration plug, and an input/output pad, which is disposed on an outside surface of the second substrate and is connected to the penetration plug.

20. The three-dimensional semiconductor memory device of claim 17, wherein each of the memory cells comprises a cell transistor and a capacitor, which is connected to an end of the cell transistor, the cell transistor comprises a semiconductor pattern parallel to the top surface of the first substrate, and the capacitor is connected to an end of the semiconductor pattern and comprises a storage electrode parallel to the top surface of the first substrate.

* * * * *